United States Patent
Yarus et al.

(10) Patent No.: US 12,158,556 B2
(45) Date of Patent: Dec. 3, 2024

(54) SYSTEMS AND METHODS TO ANALYZE A FORMATION

(71) Applicant: Landmark Graphics Corporation, Houston, TX (US)

(72) Inventors: Jordan Michael Yarus, Houston, TX (US); Jeffrey Mark Yarus, Shaker Heights, OH (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 1006 days.

(21) Appl. No.: 17/086,089

(22) Filed: Oct. 30, 2020

(65) Prior Publication Data

US 2022/0137257 A1 May 5, 2022

(51) Int. Cl.
  *G01V 11/00* (2006.01)
  *G01V 20/00* (2024.01)
  *G06F 30/20* (2020.01)

(52) U.S. Cl.
  CPC ............ *G01V 11/002* (2013.01); *G01V 20/00* (2024.01); *G06F 30/20* (2020.01)

(58) Field of Classification Search
  CPC ........ G01V 11/002; G01V 20/00; G06F 30/20
  See application file for complete search history.

(56) References Cited

U.S. PATENT DOCUMENTS

| | | | |
|---|---|---|---|
| 6,044,327 A | 3/2000 | Goldman | |
| 7,043,367 B2 | 5/2006 | Granjeon | |
| 7,079,953 B2 | 7/2006 | Thorne et al. | |
| 7,970,593 B2 | 6/2011 | Roggero et al. | |
| 8,101,907 B2 | 1/2012 | Jacobi et al. | |
| 8,712,746 B2 | 4/2014 | Tillier et al. | |
| 9,134,457 B2 | 9/2015 | Hurley et al. | |
| 9,514,096 B2 | 12/2016 | Granjeon | |
| 10,400,590 B1 | 9/2019 | Aldred | |
| 2014/0149041 A1 | 5/2014 | Sung et al. | |

(Continued)

FOREIGN PATENT DOCUMENTS

| EP | 3567524 A1 | 11/2019 |
|---|---|---|
| WO | 2017111966 A1 | 6/2017 |

OTHER PUBLICATIONS

Lerat, O., et al., (Nov. 2007). Construction of a Stochastic Geological Model Constrained by High-Resolution 3D Seismic Data—Application to the Girassol Field, Offshore Angola. In SPE Annual Technical Conference and Exhibition? (pp. SPE-110422). SPE. (Year: 2007).*

(Continued)

*Primary Examiner* — Bijan Mapar
(74) *Attorney, Agent, or Firm* — Barnes & Thornburg LLP

(57) ABSTRACT

Systems and methods to assess formation data are disclosed. The method includes partitioning a formation containing a plurality of rock types into a plurality of sections. For a section of the plurality of sections, the method also includes determining, for each rock type of the plurality of rock types, a probability that the rock type is present in the section. The method further includes assigning a value to the section of the plurality of sections based on a probability that the section contains one or more rock types of the plurality of rock types. The method further includes analyzing the formation based on the value associated with the section.

17 Claims, 21 Drawing Sheets

(56) References Cited

U.S. PATENT DOCUMENTS

2015/0316668 A1 11/2015 Kolbjornsen et al.
2016/0124114 A1 5/2016 Tawile et al.

OTHER PUBLICATIONS

Labourdette, R., Hegre, J., Imbert, P., & Insalaco, E. (2008). Reservoir-scale 3D sedimentary modelling: approaches to integrate sedimentology into a reservoir characterization workflow. Geological Society, London, Special Publications, 309(1), 75-85. (Year: 2008).*

Schlumberger Limited; "PetroMod Petroleum Systems Modeling Software"; webpage; 2020; https://www.software.slb.com/products/petromod.

Schlumberger Limited; "Petrel E&P Software Platform"; webpage; 2020; https://www.software.slb.com/products/petrel.

Emerson Electric Co.; "Roxar—Turning Information into Value"; website; 2020; https://www.emerson.com/en-us/automation/roxar.

Emerson Paradigm Holding LLC; "GOCAD—From simple to complex: 20 years of high-quality subsurface modeling."; website; 2020; https://www.pdgm.com/products/gocad/#.

Emerson Paradigm Holding LLC; "SKUA-GOCAD—Better field development through true collaboration and geological integrity."; website; 2020; https://pdgm.com/products/skua-gocad/#.

IHS Markit; "Geological interpretation software using Petra"; website; 2020; https://ihsmarkit.com/products/petra-geological-analysis.html.

IHS Markit; "Kingdom: Seismic and geological interpretation software"; website; 2020; https://ihsmarkit.com/products/kingdom-seismic-geological-interpretation-software.html.

Halliburton | Landmark; "Manually interpreting hundreds of wells is time-consuming, and it introduces inconsistencies through human bias of the interpreter."; website; 2020; https://www.landmark.solutions/assisted-Lithology-Interpretation.

Halliburton | Landmark; "Nexus® Software Suite"; website; 2020; https://www.landmark.solutions/Nexus-Reservoir-Simulation.

Halliburton | Landmark; "DecisionSpace® Geosciences 10ep"; website; 2020; https://www.landmark.solutions/DecisionSpace-Geosciences-10EP.

Halliburton | Landmark; "Permedia® Petroleum Systems Modeling"; website; 2020; https://www.landmark.solutions/Permedia-Petroleum-Systems-Modeling.

International Search Report and Written Opinion issued Jul. 28, 2021, in related PCT/US2020/059542.

Yarus, Jeffrey M., et al., "Facies Simulation in Practice: Lithotype Proportion Mapping and Plurigaussian Simulation, a Powerful Combination," Ninth International Geostatistics Congress, Oslo, Norway, Jun. 11-15, 2012, https://www.landmark.solutions/Portals/0/LMSDocs/Whitepapers/2012-08-facies-simulation-in-practice-white-paper.pdf.

* cited by examiner

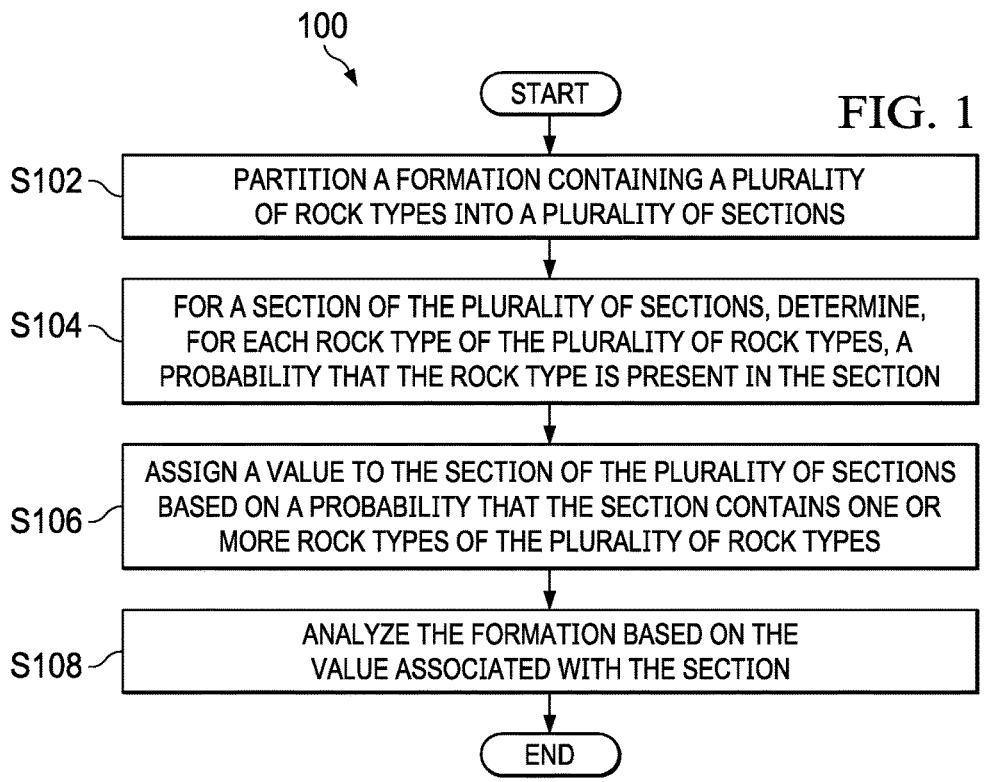

1100

| 820 | 820 | 640 | 20,800 | 820 | 20,440 | 1,000 | 1,000 | 40,600 | 22,420 |
|---|---|---|---|---|---|---|---|---|---|
| 1,000 | 640 | 820 | 820 | 820 | 20,620 | 20,800 | 820 | 40,420 | 20,620 |
| 1,000 | 820 | 1,000 | 1,000 | 1,000 | 820 | 20,620 | 60,400 | 40,420 | 20,620 |
| 460 | 820 | 20,800 | 20,800 | 1,000 | 20,800 | 20,800 | 22,420 | 60,220 | 60,220 |
| 1,000 | 820 | 20,800 | 40,600 | 820 | 60,400 | 80,200 | 42,400 | 40,600 | 40,420 |
| 1,000 | 640 | 100 | 60,220 | 100,000 | 60,400 | 60,220 | 20,620 | 20,620 | 20,620 |
| 460 | 640 | 280 | 20,620 | 60,400 | 60,400 | 80,020 | 20,440 | 820 | 1,000 |
| 640 | 640 | 1,000 | 1,000 | 40,600 | 20,800 | 40,420 | 20,440 | 640 | 2,440 |
| 100 | 820 | 1,000 | 20,800 | 1,000 | 1,000 | 22,420 | 20,620 | 60,400 | 820 |
| 640 | 640 | 1,000 | 20,800 | 20,800 | 1,000 | 20,620 | 20,440 | 20,620 | 640 |

FIG. 11

SYSTEMS AND METHODS TO ANALYZE A FORMATION

BACKGROUND

The present disclosure relates generally to systems and methods to analyze a formation.

Petroleum engineers sometimes analyze models of a formation to determine the rock and hydrocarbon content of the formation, estimate an amount of extractable petroleum held in the formation, and analyze fluid flow of fluids, including hydrocarbon resources, through the formation. However, formation models, such as three-dimensional lithology models, sometimes do not provide sufficient resolution of a formation. Further, formation models often do not accurately represent the rock content and physical properties of the formation. As a consequence, models of fluid flow through the formation are generated based on poorly resolved and inaccurately determined rock properties that often require reservoir engineers to make drastic edits and broad assumptions in order to match observed real life fluid flow of the formation.

BRIEF DESCRIPTION OF THE DRAWINGS

Illustrative embodiments of the present disclosure are described in detail below with reference to the attached drawing figures, which are incorporated by reference herein, and wherein:

FIG. 1 is a flow chart of a process to analyze a formation;

FIG. 2 is a graph representing a formation that is partitioned into 10 sections by 10 sections in two directions, where each cell of the graph represents a section of the formation;

FIG. 11 illustrates the formation of FIG. 2, where each cell includes a value representative of the probability that the corresponding section contains one or more of high porosity siltstone, siltstone, dolomite, and carbonate mud;

Figure 3A:
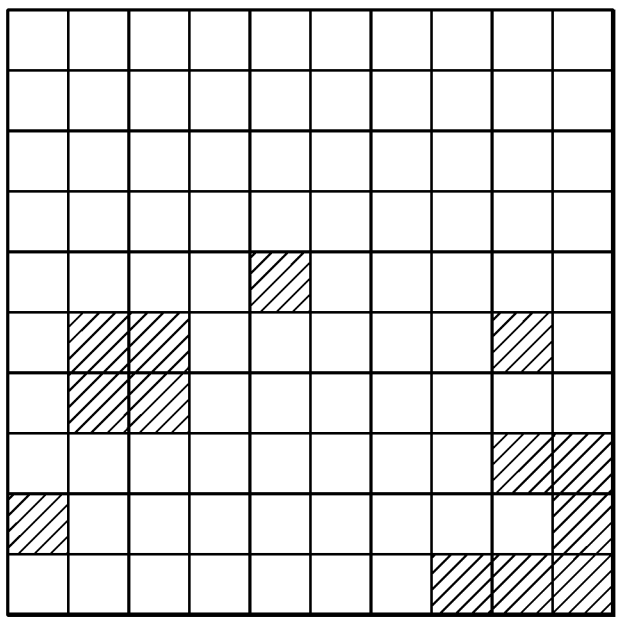
FIGS. 3A-3E illustrate five different iterations of a lithological analysis of the formation of FIG. 2 to determine the probability of the presence of high porosity siltstone in the formation.

The illustrated figures are only exemplary and are not intended to assert or imply any limitation with regard to the environment, architecture, design, or process in which different embodiments may be implemented.

DETAILED DESCRIPTION

In the following detailed description of the illustrative embodiments, reference is made to the accompanying drawings that form a part hereof. These embodiments are described in sufficient detail to enable those skilled in the art to practice the invention, and it is understood that other embodiments may be utilized and that logical structural, mechanical, electrical, and chemical changes may be made without departing from the spirit or scope of the invention. To avoid detail not necessary to enable those skilled in the art to practice the embodiments described herein, the description may omit certain information known to those skilled in the art. The following detailed description is, therefore, not to be taken in a limiting sense, and the scope of the illustrative embodiments is defined only by the appended claims.

The systems and methods to analyze a formation are disclosed. The system is configured to partition a formation that contains multiple rock types into a plurality of sections. FIG. 2, for example, is a graph of a formation that is partitioned into 10 sections by 10 sections in two directions, where each cell of the graph represents a section of the formation. Examples of different rock types include, but are not limited to, high porosity siltstone, siltstone, carbonate mud, dolomite, sandstone, shale, chalk, limestone, salt, granite, as well as other rock types. The system is also configured to determine the probability that different rock types of the formation are found in one or more sections of the formation. More particularly, the system is configured to analyze one or more sections of the formation, and for each analyzed section, determine the probability that a rock type is present in the section. In some embodiments, the system is configured to utilize multiple different types of lithological analysis (such as lithology models resulting from stochastic and deterministic methods) to determine the probability that each rock type of multiple rock types of the formation is also present in the section. In some embodiments, the system consumes multiple realizations of a lithological analysis of the one or more sections of the formation to determine the probability that each rock type of multiple rock types of the formation is also present in one or more sections, then performs different physical analysis of the one or more sections of the formation using the probabilities as actual occurrences. As referred to herein, a lithological analysis of a formation is an analysis of the physical characteristics of the formation. In some embodiments, a lithological analysis is performed prior to modeling the formation and prior to undergoing the proposed method using observations from outcrops, sampled wireline signals and core samples which undergo physical and chemical testing. The results of this analysis are then used to generate stochastic and deterministic sub-surface reservoir and basin models using a wide range of existing methods including but not limited to Plurigaussian Simulation, Sequential Indicator Simulation, Truncated Gaussian Simulation, Indicator Kriging, Multipoint Statistics, Object modeling, Machine learning methods, and other types of modeling. Additional descriptions of operations to analyze sections of the formation and to determine the probability that different rock types are present in the sections of the formation are provided herein and are illustrated in at least FIGS. 1-12.

The system is also configured to assign a value to each section of the one or more sections based on the probability that the section contains one or more rock types found in the formation. For example, where the system determines that a section has a 20% probability to contain dolomite, a 20% probability to contain carbonate mud, a 40% probability to contain siltstone, and a 20% probability to contain high porosity siltstone, the system assigns the section a value of 22420. Further in this example, where the system determines that a section has a 40% probability to contain dolomite, a 0% probability to contain carbonate mud, a 40% probability to contain siltstone, and a 20% probability to contain high porosity siltstone, the system assigns the section a value of 42420. Additional examples of values generated by the system that are based on the probability that different rock types of a formation are found in a section are provided herein. In some embodiments, the system is also configured to generate different visual representations of the probability that different rock types of the formation are found in a section. In some embodiments, the system is also configured to blend different properties of different rock types that are determined to be present in a section.

The system is further configured to analyze the formation based on values that are assigned to different sections of the formation. In some embodiments, the system is further configured to generate a model of the formation based on the values associated with the sections, and provide the model for display on an electronic display of a user. In some embodiments, the system is further configured to utilize values assigned to different sections to enhance an existing fluid flow model of fluid flow through the different sections. In some embodiments, the system is also configured to utilize values assigned to different sections as inputs to generate a fluid model of flow through the different sections. In one or more of such embodiments, the system is further configured to provide the fluid flow model for display on an electronic display. In some embodiments, the system is further configured to generate a model representative of the amount of hydrocarbon resources (such as, but not limited to, total hydrocarbon resources and extractable hydrocarbon resources) in the formation based on the values that are assigned to sections of the formation, and provide the model for display on an electronic display of a user. In one or more of such embodiments, values that are assigned to sections of the formation are utilized to obtain volumetric as well as the generation and recovery of hydrocarbon resources in the formation. For example, the values are utilized to estimate the size and quantity of the pores as well as many other physical properties to improve the accuracy of the estimation of how much fluid is in the pores and the overall quantity of fluid that is recoverable. Additional descriptions of the foregoing systems and methods to analyze a formation are described in the paragraphs below and are illustrated in FIGS. 1-16.

Now turning to the figures, FIG. 1 is a flow chart of a process 100 to analyze a formation. Process 100 may be performed by any of the systems described herein, including formation analysis system 1504 of FIG. 15. Although the operations in the process 100 are shown in a particular sequence, certain operations may be performed in different sequences or at the same time where feasible. As described below, process 100 provides an intuitive way to analyze a formation.

At block S102, a formation containing a plurality of rock types is partitioned into a plurality of sections. FIG. 2, for example, illustrates a graph of a formation that is partitioned into 10 sections by 10 sections in two directions. In some embodiments, a petrophysical analysis of a lithology of the formation is performed to determine the plurality of rock types of the formation. In one or more of such embodiments, a structural modeling of the formation is also generated and utilized as an initial model of the formation. More particularly, the geometrical extents of a subsurface structure or basin structure are defined and serve as a container of the formation, which is then divided into cells or sections.

At block S104, for a section of the plurality of sections, a probability that a rock type of the formation is present in the section is determined for each rock type of different rock types of the formation. For example, FIGS. 3A, 5A, 7A, and 9A illustrate a determination of the probability of the presence of high porosity siltstone, siltstone, carbonate mud, and dolomite, respectively, in section 201, or another section. In some embodiments, a threshold number of iterations (such as five iterations, ten iterations, or another number of iterations) of a lithological analysis is performed to determine the probability that a rock type of the formation is present in a section. In one or more of such embodiments, the threshold number of iterations is user-designated as well as the methods used for generating the iterations. In one or more of such embodiments, the threshold number of iterations is pre-determined, or is dynamically increased to quantify the uncertainty of any given estimate in any given section. In one or more of such embodiments, the number of resulting iterations is based on variables such as the number and spatial distribution of control points (measured or sampled locations or otherwise known values, which have been observed and will not be estimated but leveraged for the purpose of estimating unsampled locations). In the embodiment illustrated by FIGS. 3A-3E, five iterations of a lithological analysis of the probability of the presence of high porosity siltstone are performed to determine the probability of the presence of high porosity siltstone in each of cells 201-300. In one or more of such embodiments, a ratio of the number of times the rock type is present in the section to the threshold number of iterations of the lithological analysis is performed and determined, where the probability that the rock type is present in the section is the ratio. Continuing with the embodiment illustrated in FIGS. 3A-3E, two of five iterations of a lithological analysis of the probability of the presence of high porosity siltstone determined that high porosity siltstone is present in cell 203, which indicates that there is a 40% probability that high porosity siltstone is present in a section of the formation represented by cell 203. Similarly, one of five iterations of a lithological analysis of the probability of the presence of high porosity siltstone determined that high porosity siltstone is present in cell 201, which indicates that there is a 20% probability that high porosity siltstone is present in a section of the formation represented by cell 201. In the embodiment of FIGS. 3A-3E, five iterations of a lithological analysis of the probability of the presence of high porosity siltstone are performed on each section of the formation represented by cells 201-300 to determine the probability of the presence of high porosity siltstone in the sections of the formation. Similarly, in the embodiments of FIGS. 5A-5E, 7A-7E, and 9A-9E, five iterations of a lithological analysis of the probability of the presence of siltstone, carbonate mud, and dolomite, respectively, are performed on each section of the formation represented by cells 201-300 to determine the probability of the presence of siltstone, carbonate mud, and dolomite, respectively, in the respective section of the formation.

In some embodiments, one or more graphical representations of the probability of presence of a rock type of the formation in one or more sections of the formation are generated. For example, in the embodiment of FIG. 4, graph 400 represents the probability of high porosity siltstone in the formation of FIG. 2 based on the five different iterations of the lithological analysis illustrated in FIGS. 3A-3E, where six different patterns, colors or other types of visual representations correspond to different probabilities of the presence of high porosity siltstone in cells 201-300. In one or more of such embodiments, graphical representations of the probability of the presence of a rock type are provided for display on an electronic display to help a user analyze properties of the formation.

Figure 12:
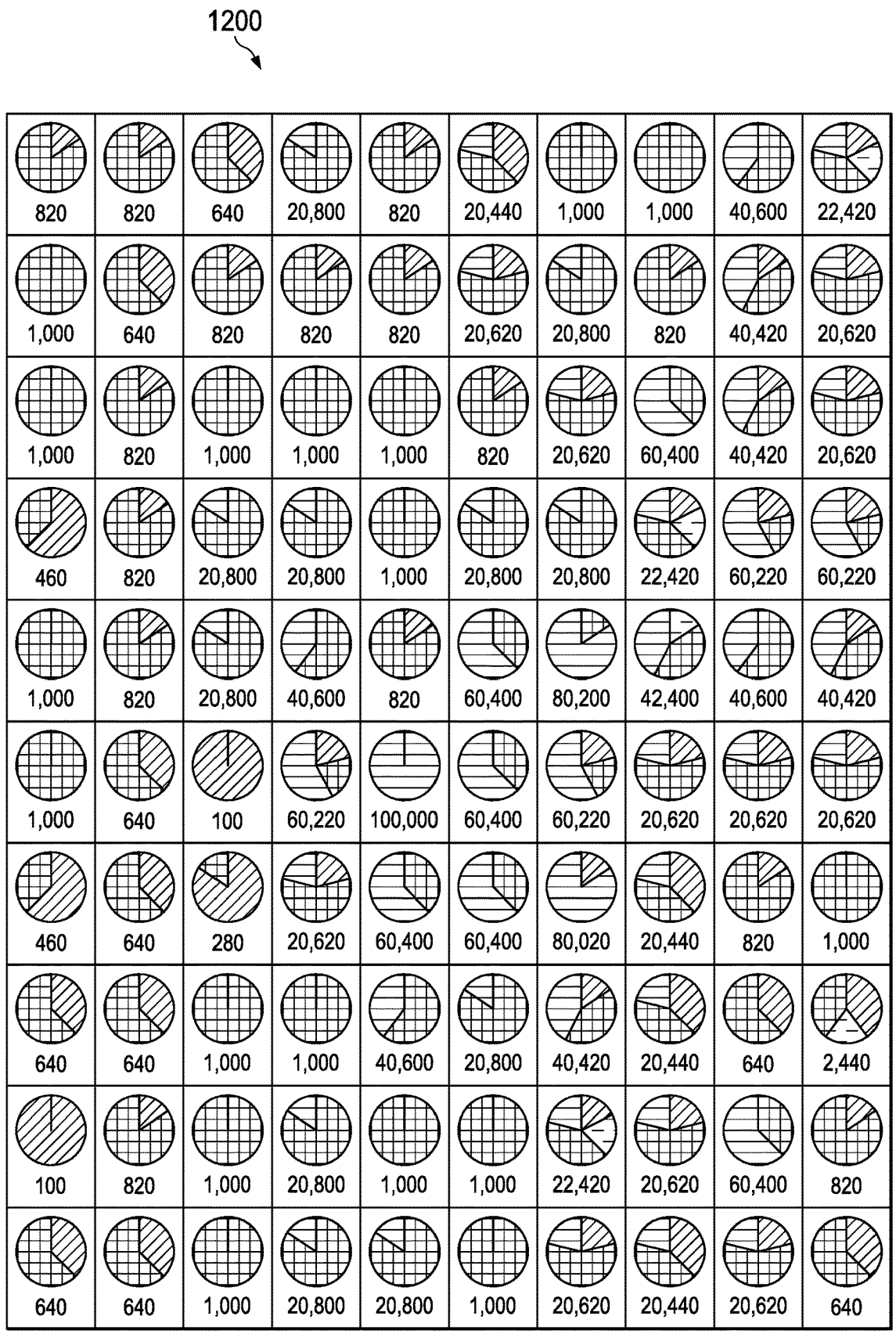
FIG. 12 illustrates the formation of FIG. 2, where each cell includes a pie chart and a value representative of the probability that the corresponding section contains one or more of high porosity siltstone, siltstone, dolomite, and carbonate mud.

At block S106, a value based on a probability that a section contains one or more rock types of the plurality of rock types is assigned to the section. In the embodiment of FIG. 11, the value of each cell 201-300 is derived from the probabilities that high porosity siltstone, siltstone, carbonate mud, and dolomite, respectively, are determined present in a section associated with the corresponding cell. For example, in the embodiments illustrated by FIGS. 4, 6, 8, and 10, high porosity siltstone, siltstone, carbonate mud, and dolomite are determined to have a 20% probability (high porosity siltstone), 80% probability (siltstone), 0% probability (carbonate mud), and 0% probability (dolomite) to be present in cell 201 respectively. In the embodiment of FIG. 11, a value of 820 is assigned to cell 201, which indicates that there is an 80% probability that siltstone is present in the section associated with cell 201, a 20% probability that high porosity siltstone is present in the section associated with cell 201, and a 0% probability that dolomite or carbonate mud is present in the parathion associated with cell 201. Similarly, a value of 22420 is associated to cell 209, which indicates that there is a 40% probability that siltstone is present in the section associated with cell 209, a 20% probability that high porosity siltstone is present in the section associated with cell 201, a 20% probability that dolomite is present in the parathion associated with cell 209, and a 20% probability that carbonate mud is present in the parathion associated with cell 209. In some embodiments, predetermined values are assigned to different probabilities that a section contains one or more rock types of the formation. In some embodiments, user-designated values are assigned to represent different probabilities that a section contains one or more rock types of the formation. In some embodiments, randomly generated values are assigned to different probabilities that a section contains one or more rock types of the formation. In some embodiments, a graphical representation of the probability that one or more sections of a formation contain one or more rock types of the formation is generated and provided for display on an electronic device. FIG. 12, for example, illustrates a graph 1200, where each cell 201-300 of graph 1200 includes a pie chart and a value representative of the probability that the corresponding section contains one or more of high porosity siltstone, siltstone, dolomite, and carbonate mud.

In some embodiments, where a section is determined to likely include multiple rock types, properties of each rock type are blended together to simulate properties of a blended rock type. As referred to herein a blended rock type is a rock type having properties of two or more rock types, such as 50% high porosity siltstone, and 50% siltstone. In one or more of such embodiments, each unique value (such as values illustrated in FIG. 11 and Table T-1) represents a proportional mixture of the initial rock types (lithologies). In one or more of such embodiments, one or more blending methods are applied to the underlying physical properties associated with each lithology present in each section. In one or more embodiments, the blending methods define how underlying physical property values are blended as to represent the physical properties of the mixture of rock types present in each section. Examples of blending methods for any defined physical property include, but are not limited to, the maximum value of a physical property from all of the members of a blended rock type, the minimum value of a physical property from all of the members of the blended rock type, the proportion value of a property from all of the members of the blended rock type, the mean geometric value of a property from all of the members of the blended rock type, the mean arithmetic value of a property from all of the members of the blended rock type, the mean harmonic value of a property from all of the members of the blended rock type, the Root Mean Squared value of a property from all of the members of the blended rock type, and the Log Proportion value of a property from all of the members of the blended rock type. In one or more of such embodiments, the physical properties associated with each member of a blended rock type can be constant or non-constant. For example, for a mixture of different rock types, the heat conductivity, or any physical property are first defined for each member of all of the blended rock types, and then be combined to represent the proportions of the blended rock types found in each section. Examples of non-constant attribute relations include, but are not limited to, depth-porosity curve, maximum effective stress-porosity curve, porosity-permeability curve, porosity-threshold pressure curve, porosity-Socr curve, and porosity-Swc curve. In one or more of such embodiments, the underlying physical properties associated with each lithology present in each section is constant. Examples of constant physical properties for all rock types include, but are not limited to, grain density, compressibility, thermal matric conductivity, conductivity anisotropy, matrix specific heat, matrix radiogenic heat, and Poisson's ratio. In some embodiments, a physical property's value is assigned by applying a blending method, as described above, to the underlying physical properties using the proportions found in each section as weights. For example, a blended rock type of 50% high porosity siltstone, and 50% siltstone is assigned a blended lithology value, or code, of 550, and underlying physical property values would be weighted evenly (50 to 50) as blending method is applied and blended physical property value is calculated. Similarly, a blended rock type of 75% high porosity siltstone, and 25% siltstone is assigned a value, or code of 7525 and the underlying physical property values for high porosity siltstone would be weighted three times that of the siltstone (75 to 25) as blending method is applied and blended physical property value is calculated. Additional descriptions of operations performed to simulate properties of a blended rock type and generate a value of the blended rock type are provided herein and are illustrated in at least FIGS. 13 and 14.

At block 108, the formation is analyzed based on the value associated with the section. In some embodiments, a model of the formation is generated based on values associated with sections of the formation. In one or more of such embodiments, a different color is assigned to each different value of the values associated with sections of the formation. In one or more of such embodiments, a color coded model, where different colors represent different values associated with the sections are provided for display on an electronic display of a user. In some embodiments, a model of fluid flow flowing through the formation is generated based on the values associated with sections of the formation. In one or more of such embodiments, values associated with sections of the formation, which are indicative of properties of different rock types and blended rock types of the formation, are utilized as inputs to enhance an existing fluid flow model or to generate a new fluid flow model of fluid flow through the different sections. In one or more of such embodiments, the fluid flow model is provided for display on an electronic display of a user. In some embodiments, a petrophysical analysis of the formation is performed based on values associated with sections of the formation. In some embodiments, a lithology of the formation is performed based on values associated with sections of the formation. In some embodiments, the presence and amount of hydrocarbon resources, including but not limited to, the amount of extractable and extraction rate of hydrocarbon resources, are determined based on the values associated with sections of the formation. Additional descriptions of the operations performed herein are described in the paragraphs below and are illustrated in at least FIGS. 2-16.

FIG. 2 is a graph 200 representing a formation that is partitioned into 10 sections by 10 sections in two directions, where each cell 201-300 of graph 200 represents a section of the formation. The formation contains multiple rock types, such as, but not limited to, high porosity siltstone, siltstone, carbonate mud, and dolomite. In the embodiment of FIG. 2, an approximately square two dimensional grid represents the formation. In some embodiments, the formation has a non-square shape and consists of three-dimensional layers stacked with other structural elements such as faults. Further, although each section is represented by a square shaped cell, in some embodiments, different sections have different sizes and dimensions.

FIGS. 3A-3E illustrate five different iterations of a lithological analysis of the formation of FIG. 2 to determine the probability of the presence of high porosity siltstone in the formation. More particularly, graphs 300, 320, 340, 360, and 380 of FIGS. 3A-3E represent different iterations of a lithological analysis of the formation of FIG. 2 to determine the probability of the presence of high porosity siltstone in the formation. Further, for each section of the formation determined to contain high porosity siltstone, the corresponding cell (such as cell 281 of FIGS. 3A-3E) is assigned a pattern or color, and for each section of the formation determined not to contain high porosity siltstone, the corresponding cell (such as cell 211 of FIGS. 3A-3E) is assigned another pattern (or no pattern) or color to differentiate cells associated with sections of the formation that contain high porosity siltstone from sections of the formation that do not contain high porosity siltstone. As shown in FIG. 3A, the result of a first iteration of the lithological analysis determined that some of the sections, including sections associated with cells 201, 203, 204, and 261 do not contain high porosity siltstone, whereas other sections, including sections associated with cells 263 and 281 contain high porosity siltstone.

Figure 3B:
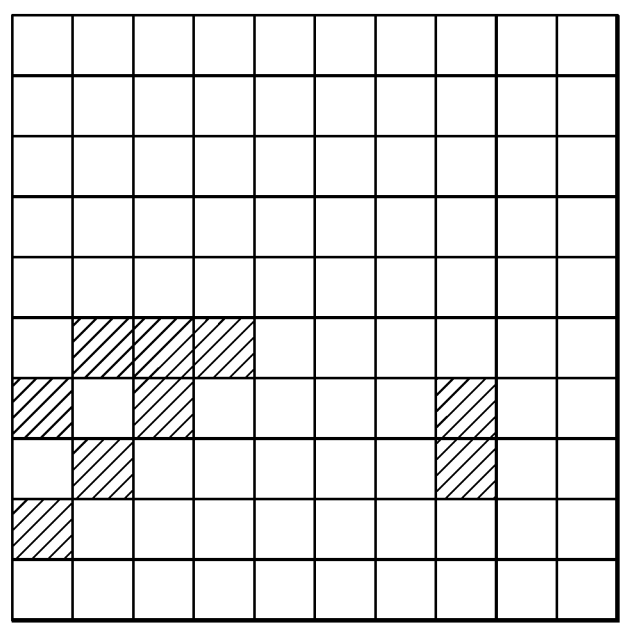
Figure 3C:
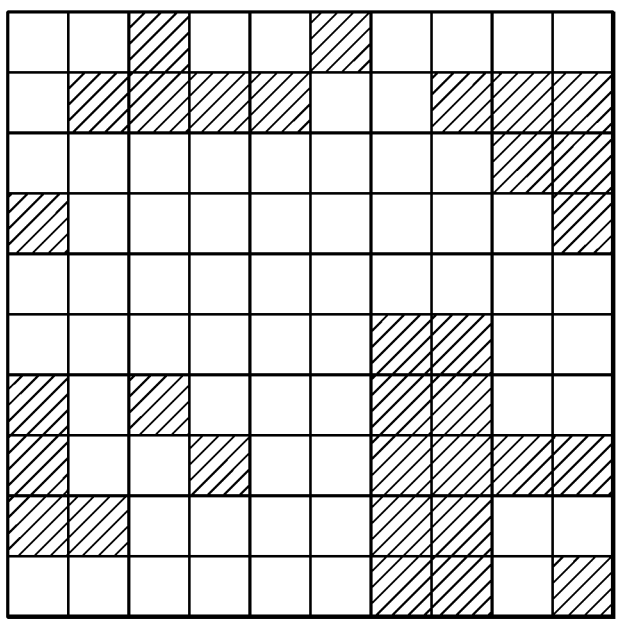
Figure 3D:
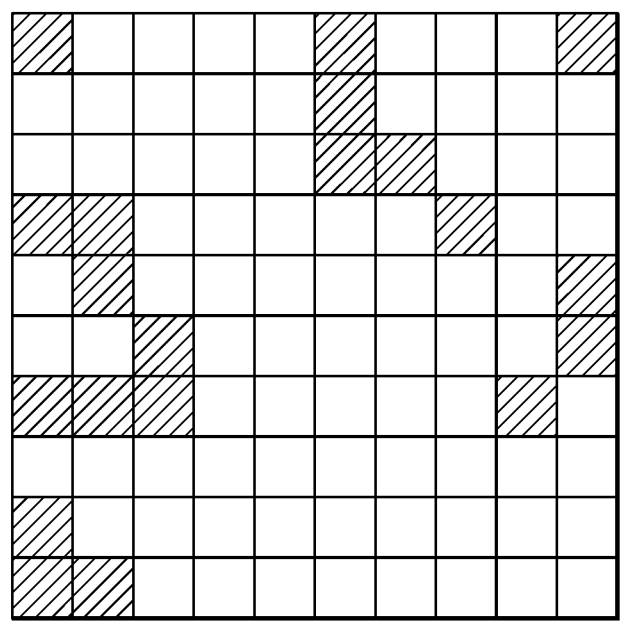
Figure 3E:
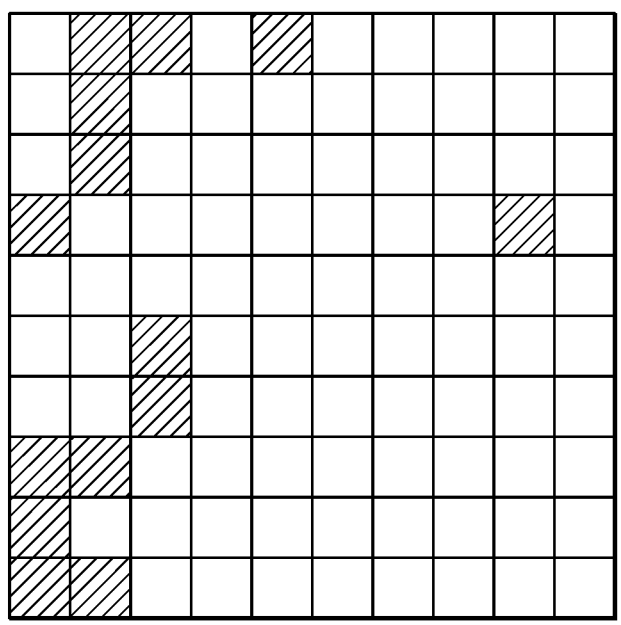

As shown in FIG. 3B, the result of a second iteration of the lithological analysis determined that some of the sections, including sections associated with cells 201, 203, and 204 do not contain high porosity siltstone, whereas other sections, including sections associated with cells 261, 263 and 281 contain siltstone. As shown in FIG. 3C, the result of a third iteration of the lithological analysis determined that some of the sections, including sections associated with cells 201, 204, and 263 do not contain high porosity siltstone, whereas other sections, including sections associated with cells 203, 261, and 281 contain siltstone. As shown in FIG. 3D, the result of a fourth iteration of the lithological analysis determined that some of the sections, including sections associated with cells 203 and 204 do not contain high porosity siltstone, whereas other sections, such as sections associated with cells 201, 261, 263, and 281 contain siltstone. As shown in FIG. 3E, the result of a fifth iteration of the lithological analysis determined that some of the sections, including sections associated with cells 201, 204, and 261 do not contain high porosity siltstone, whereas other sections, such as sections associated with cells 203, 263 and 281 contain siltstone.

Although FIGS. 3A-3E illustrate five iterations of a lithological analysis to determine the probability of the presence of high porosity siltstone in the formation, in some embodiments, a different number of iterations of the lithological analysis are performed to determine the probability of the presence of high porosity siltstone in the formation. In some embodiments, different methods or types of lithological analysis are performed to determine the probability of the presence of high porosity siltstone in the formation. In some embodiments, one or more lithological analysis are run concurrently. Further, in some embodiments, multiple iterations of a lithological analysis (or different methods or types of lithological analysis) are performed one section at a time. For example, in some embodiments, five iterations of a lithological analysis are performed to determine the probability of the presence of high porosity siltstone in a section associated with cell 201 before five iterations of the lithological analysis are performed to determine the probability of the presence of high porosity siltstone in a section associated with cell 202. In some embodiments, different sections of the formation are analyzed based on adjacency (such as section associated with cell 201 is analyzed followed by a section associated with cell 202). In some embodiments, different sections of the formation are analyzed based on a user-designated or pre-determined order. In some embodiments, the order of which different sections are analyzed are determined randomly (such as a section associated with cell 201 is analyzed followed by a section associated with cell 276, followed by a section associated with cell 298) to reduce bias. In some embodiments, the probability that a rock type is present in one section is partially based on the probability that the rock type (or a different rock type) is present in another section (such as in an adjacent section.) [

Figure 4:
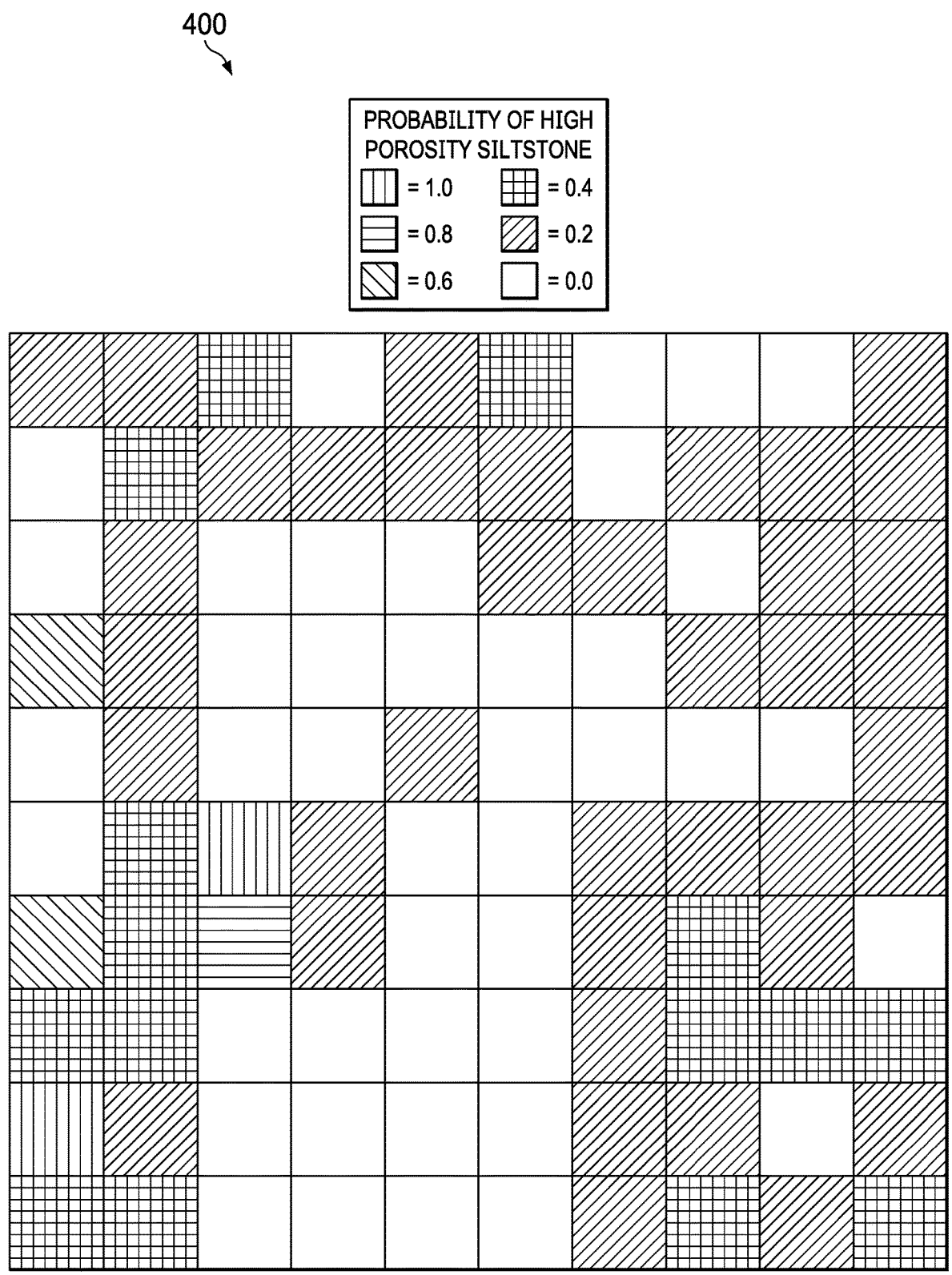
FIG. 4 illustrates the probability of high porosity siltstone in the formation of FIG. 2 based on the five different iterations of the lithological analysis illustrated in FIGS. 3A-3E.
Figure 5A:
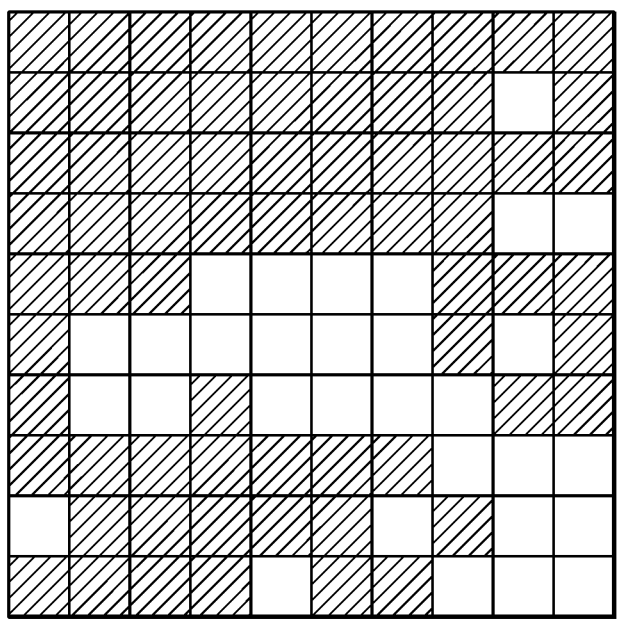
FIGS. 5A-5E illustrate five different iterations of a lithological analysis of the formation of FIG. 2 to determine the probability of the presence of siltstone in the formation.
Figure 5B:
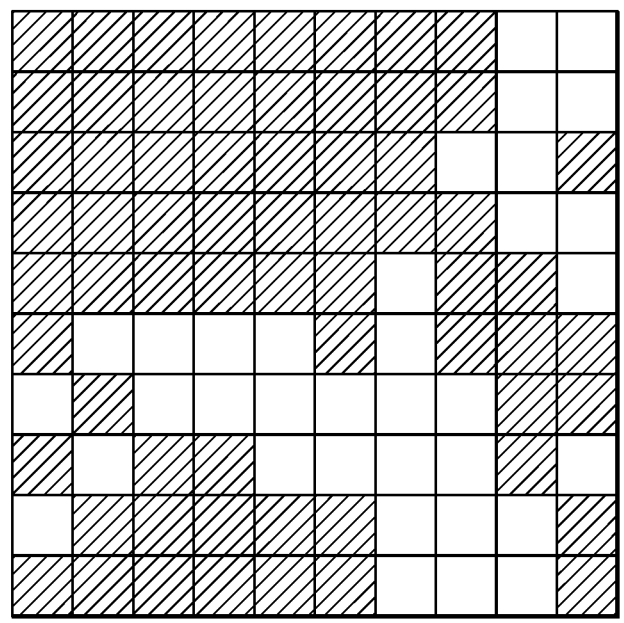
Figure 5C:
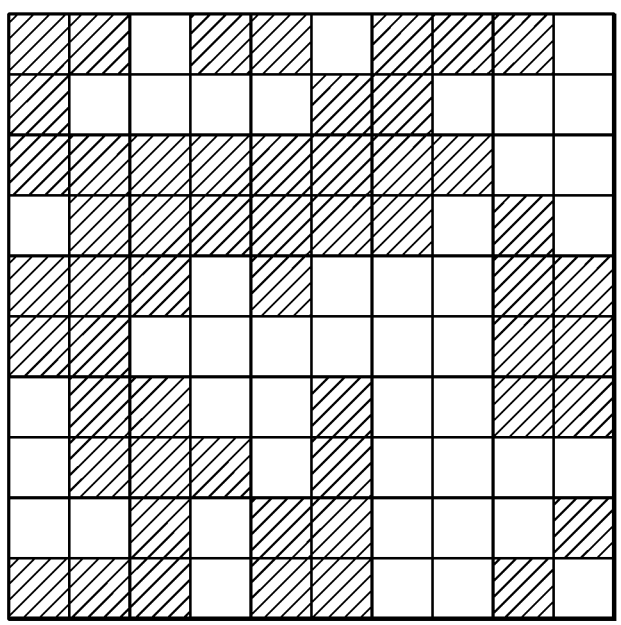
Figure 5D:
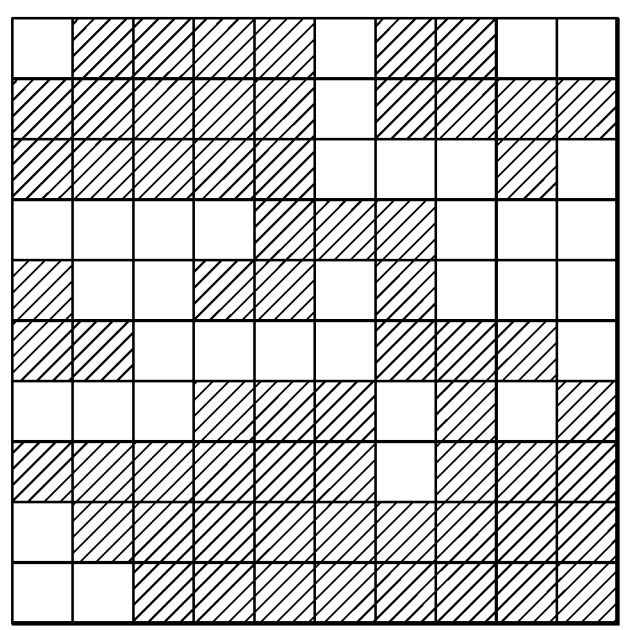
Figure 5E:
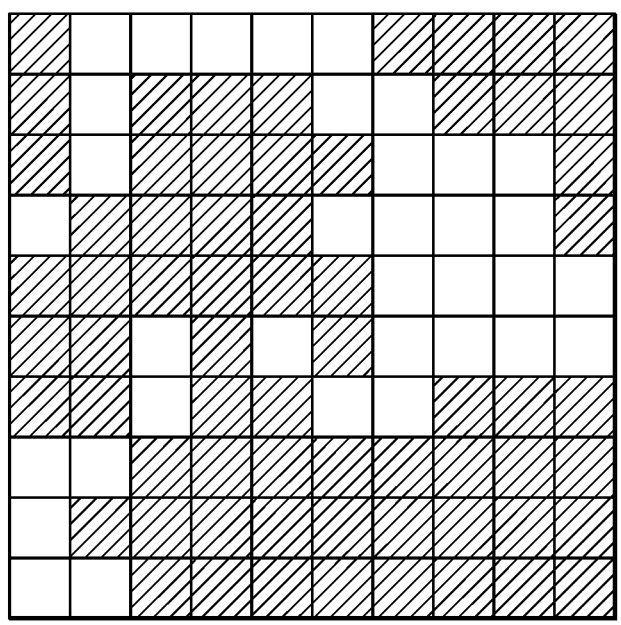

The results of the total number of iterations of the lithological analysis are combined to determine the probability of the presence of high porosity siltstone in the formation. In that regard, FIG. 4 illustrates a graph 400 of the probability of high porosity siltstone in the formation of FIG. 2 based on the five different iterations of the lithological analysis illustrated in FIGS. 3A-3E. In the embodiment of FIG. 4, cells associated with sections of the formation having different probabilities to contain high porosity siltstone are illustrated in different patterns. In some embodiments, cells associated with sections of the formation having different probabilities to contain high porosity siltstone are illustrated in different colors, or other types of visual representations to differentiate other cells associated with sections of the formation that have different probabilities to contain high porosity siltstone.

FIGS. 5A-5E illustrate five different iterations of a lithological analysis of the formation of FIG. 2 to determine the probability of the presence of siltstone in the formation. More particularly, graphs 500, 520, 540, 560, and 580 of FIGS. 5A-5E represent different iterations of a lithological analysis of the formation of FIG. 2 to determine the probability of the presence of siltstone in the formation. Further, for each section of the formation determined to contain siltstone, the corresponding cell (such as cell 263 of FIGS. 5A-5E) is assigned a pattern or color, and for each section of the formation determined not to contain siltstone, the corresponding cell (such as cell 281 of FIGS. 5A-5E) is assigned another pattern (or no pattern) or color to differentiate cells associated with sections of the formation that contain siltstone from sections of the formation that do not contain siltstone. The process to perform five different iterations of a lithological analysis of the formation of FIG. 2 to determine the probability of the presence of siltstone in the formation is similar to the process to perform five different iterations of a lithological analysis of the formation of FIG. 2 to determine the probability of the presence of high porosity siltstone in the formation, which is described in the paragraphs above.

Figure 6:
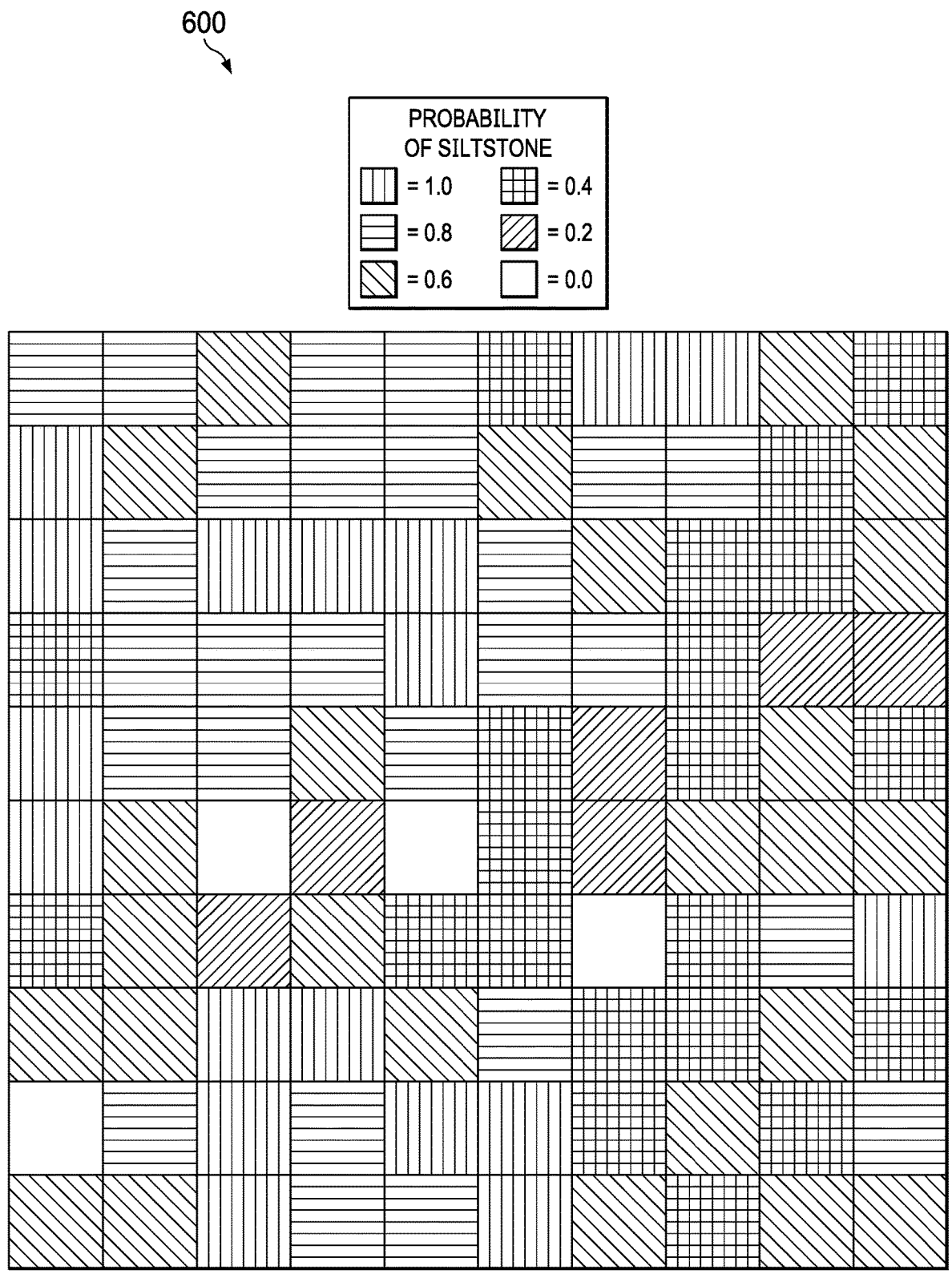
FIG. 6 illustrates the probability of siltstone in the formation of FIG. 2 based on the five different iterations of the lithological analysis illustrated in FIGS. 5A-5E.
Figure 7A:
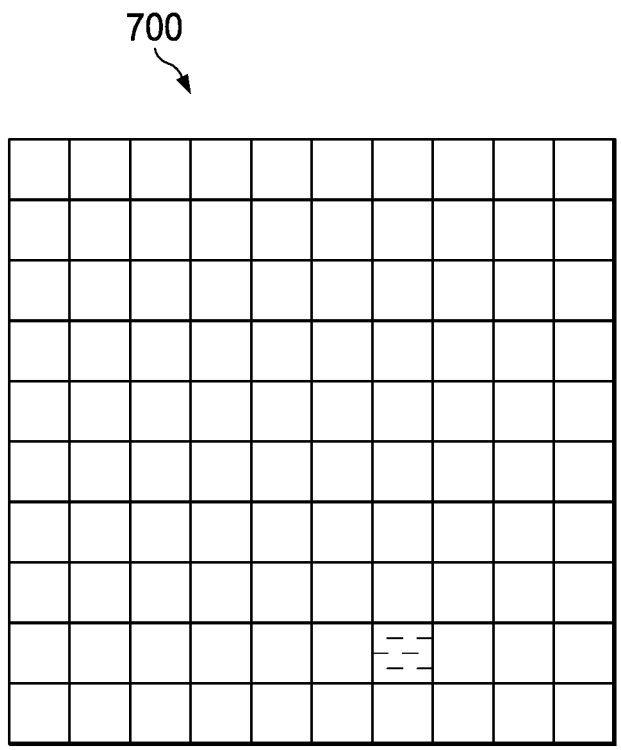
FIGS. 7A-7E illustrate five different iterations of a lithological analysis of the formation of FIG. 2 to determine the probability of the presence of carbonate mud in the formation.
Figure 7B:
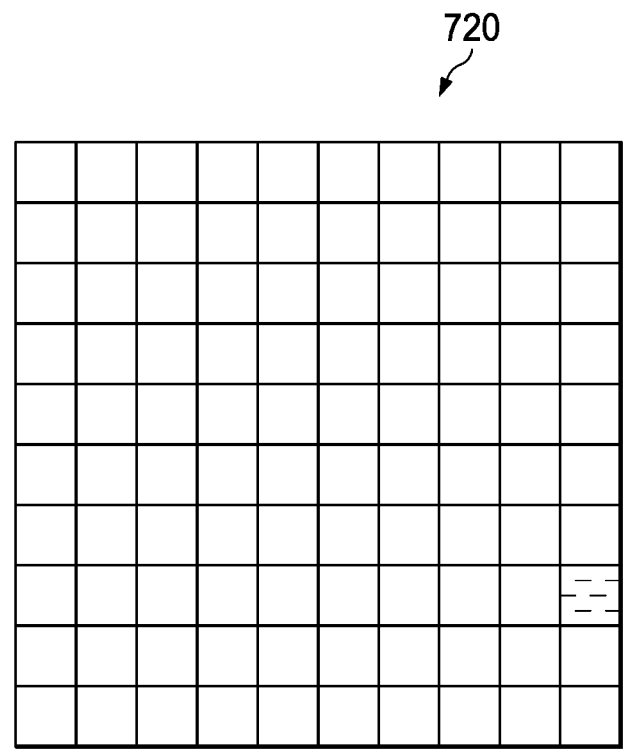
Figure 7C:
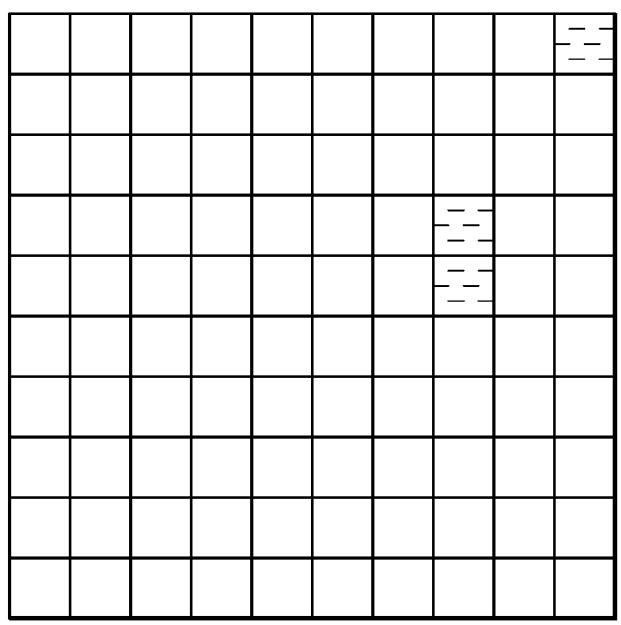
Figure 7D:
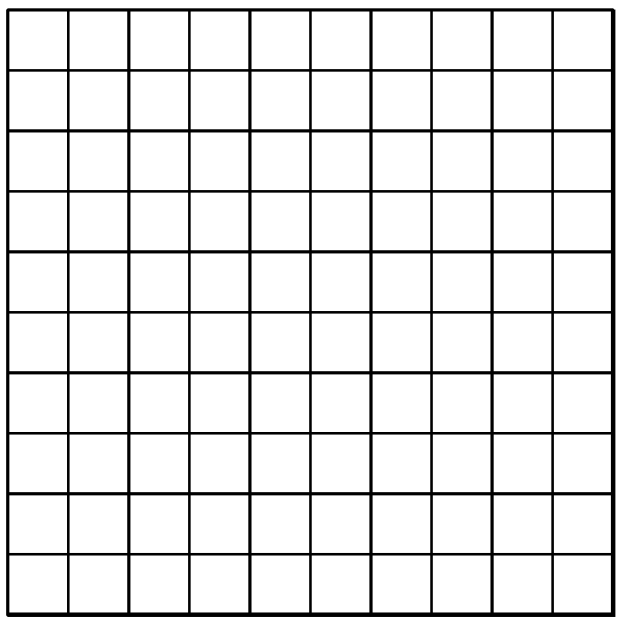
Figure 7E:
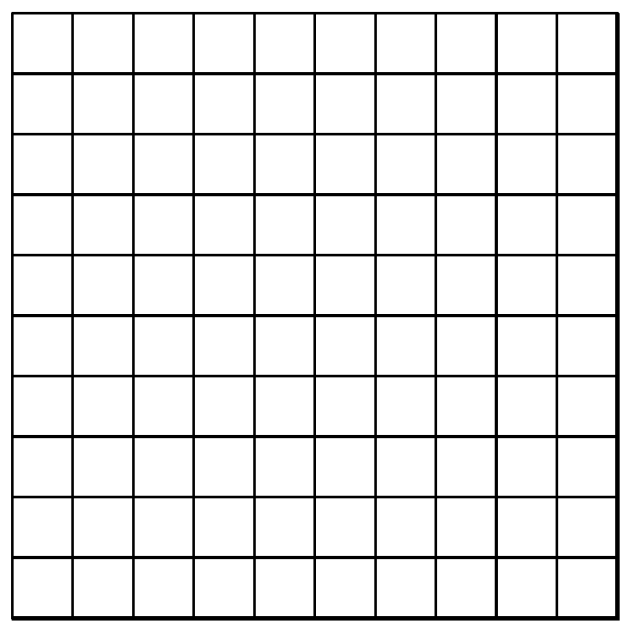

The results of the total number of iterations of the lithological analysis are combined to determine the probability of the presence of siltstone in the formation. In that regard, FIG. 6 illustrates a graph 600 of the probability of siltstone in the formation of FIG. 2 based on the five different iterations of the lithological analysis illustrated in FIGS. 5A-5E. In the embodiment of FIG. 6, cells associated with sections of the formation having different probabilities to contain siltstone are illustrated in different patterns. In some embodiments, cells associated with sections of the formation having different probabilities to contain siltstone are illustrated in different colors, or other types of visual representations to differentiate other cells associated with sections of the formation that have different probabilities to contain siltstone.

FIGS. 7A-7E illustrate five different iterations of a lithological analysis of the formation of FIG. 2 to determine the probability of the presence of carbonate mud in the formation. More particularly, graphs 700, 720, 740, 760, and 780 of FIGS. 7A-7E represent different iterations of a lithological analysis of the formation of FIG. 2 to determine the probability of the presence of carbonate mud in the formation. Further, for each section of the formation determined to contain carbonate mud, the corresponding cell (such as cell 209 of FIGS. 7A-7E) is assigned a pattern or color, and for each section of the formation determined not to contain carbonate mud, the corresponding cell (such as cell 286 of FIGS. 7A-7E) is assigned another pattern (or no pattern) or color to differentiate cells associated with sections of the formation that contain carbonate mud from sections of the formation that do not contain carbonate mud. The process to perform five different iterations of a lithological analysis of the formation of FIG. 2 to determine the probability of the presence of carbonate mud in the formation is similar to the process to perform five different iterations of a lithological analysis of the formation of FIG. 2 to determine the probability of the presence of high porosity siltstone in the formation, which is described in the paragraphs above.

Figure 8:
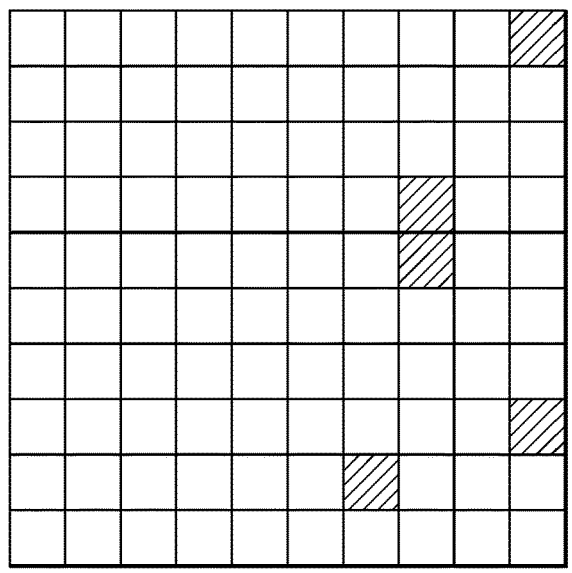
FIG. 8 illustrates the probability of carbonate mud in the formation of FIG. 2 based on the five different iterations of the lithological analysis illustrated in FIGS. 7A-7E.
Figure 9A:
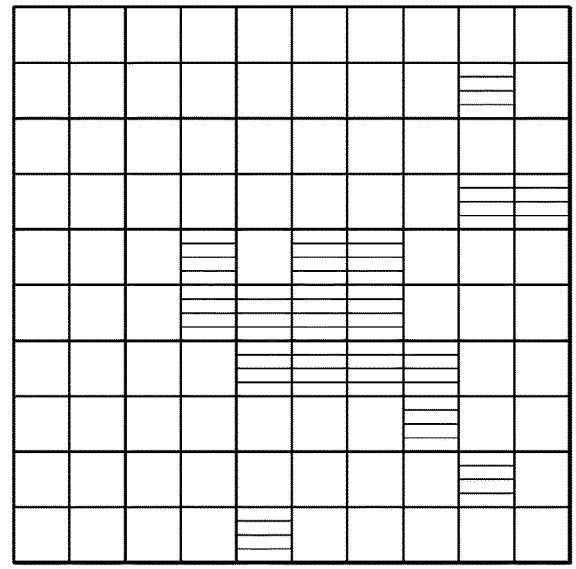
FIGS. 9A-9E illustrate five different iterations of a lithological analysis of the formation of FIG. 2 to determine the probability of the presence of dolomite in the formation.
Figure 9B:
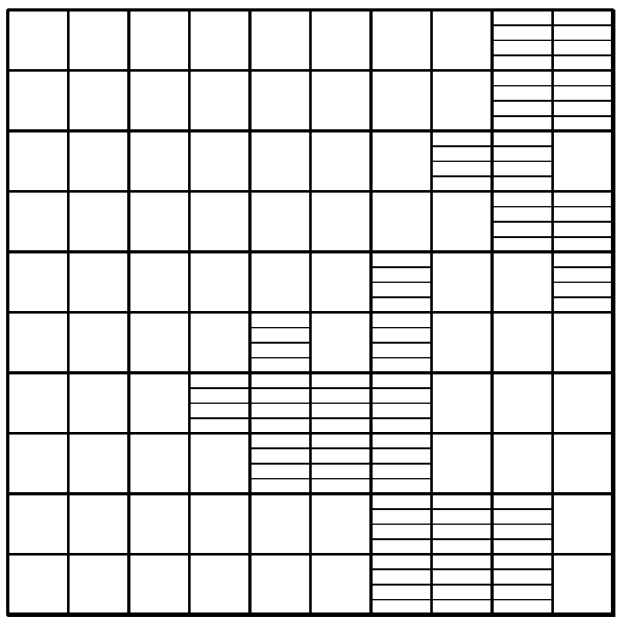
Figure 9C:
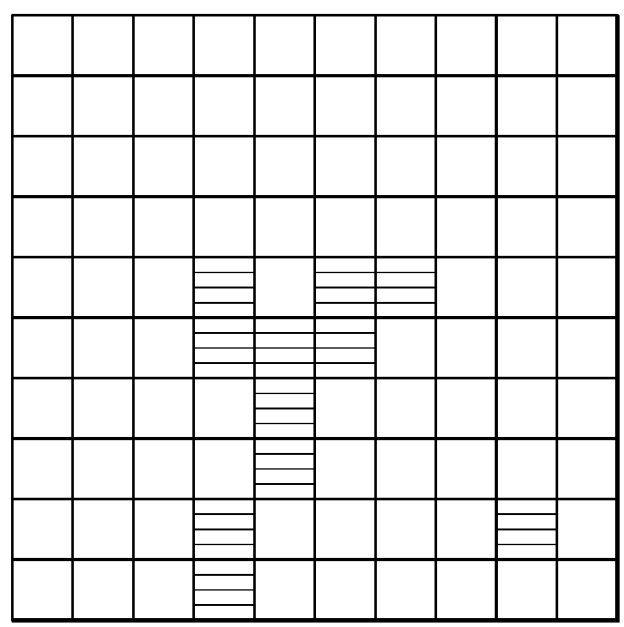
Figure 9D:
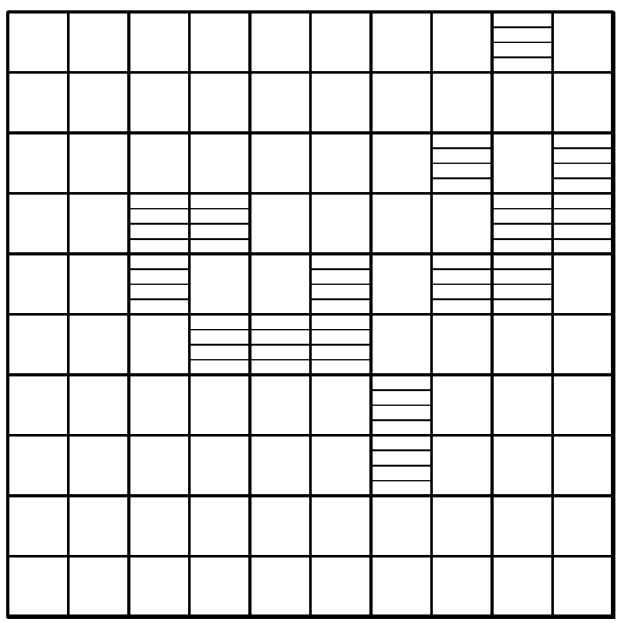
Figure 9E:
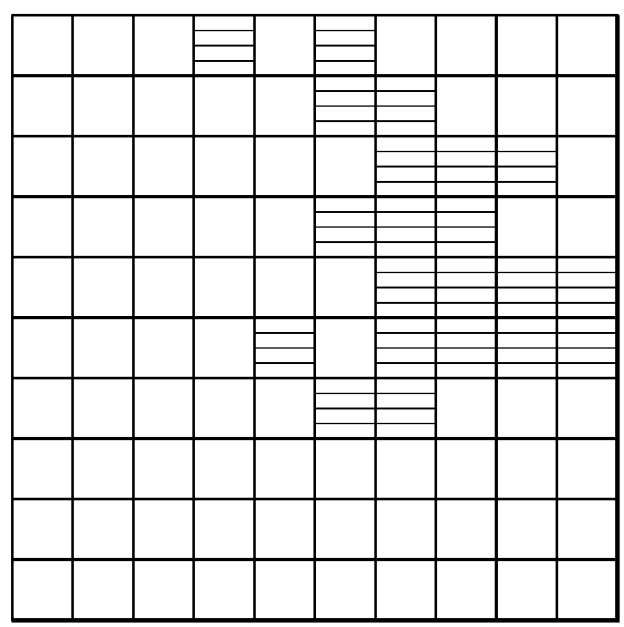

The results of the total number of iterations of the lithological analysis are combined to determine the probability of the presence of carbonate mud in the formation. In that regard, FIG. 8 illustrates the probability of carbonate mud in the formation of FIG. 2 based on the five different iterations of the lithological analysis illustrated in FIGS. 7A-7E. In the embodiment of FIG. 8, cells associated with sections of the formation having a 20% probability to contain carbonate mud are illustrated in one pattern, and cells associated with sections of the formation having a 0% probability to contain carbonate mud are illustrated in a different pattern. In some embodiments, cells associated with sections of the formation having different probabilities to contain carbonate mud are illustrated in different patterns, colors, or other types of visual representations to differentiate other cells associated with sections of the formation that have different probabilities of containing carbonate mud.

FIGS. 9A-9E illustrate five different iterations of a lithological analysis of the formation of FIG. 2 to determine the probability of the presence of dolomite in the formation. More particularly, graphs 900, 920, 940, 960, and 980 of FIGS. 9A-9E represent different iterations of a lithological analysis of the formation of FIG. 2 to determine the probability of the presence of dolomite in the formation. Further, for each section of the formation determined to contain dolomite, the corresponding cell (such as cell 255 of FIGS. 9A-9E) is assigned a pattern or color, and for each section of the formation determined not to contain dolomite, the corresponding cell (such as cell 201 of FIGS. 9A-9E) is assigned another pattern (or no pattern) or color to differentiate cells associated with sections of the formation that contain dolomite from sections of the formation that do not contain dolomite. The process to perform five different iterations of a lithological analysis of the formation of FIG. 2 to determine the probability of the presence of dolomite in the formation is similar to the process to perform five different iterations of a lithological analysis of the formation of FIG. 2 to determine the probability of the presence of high porosity siltstone in the formation, which is described in the paragraphs above.

In some embodiments, a lithological analysis of the formation to determine the probability of the presence of different rock types is performed one rock type at a time (such as lithological analysis of the high porosity siltstone, followed by lithological analysis of siltstone, carbonate mud, and dolomite). In one or more of such embodiments, the order of which rock type is analyzed first is user-designated or pre-determined. In some embodiments, lithological analysis of the formation to determine the probability of the presence of different rock types is performed concurrently. In some embodiments, lithological analysis of the formation to determine the probability of the presence of different rock types is performed in a random order to reduce bias.

Figure 10:
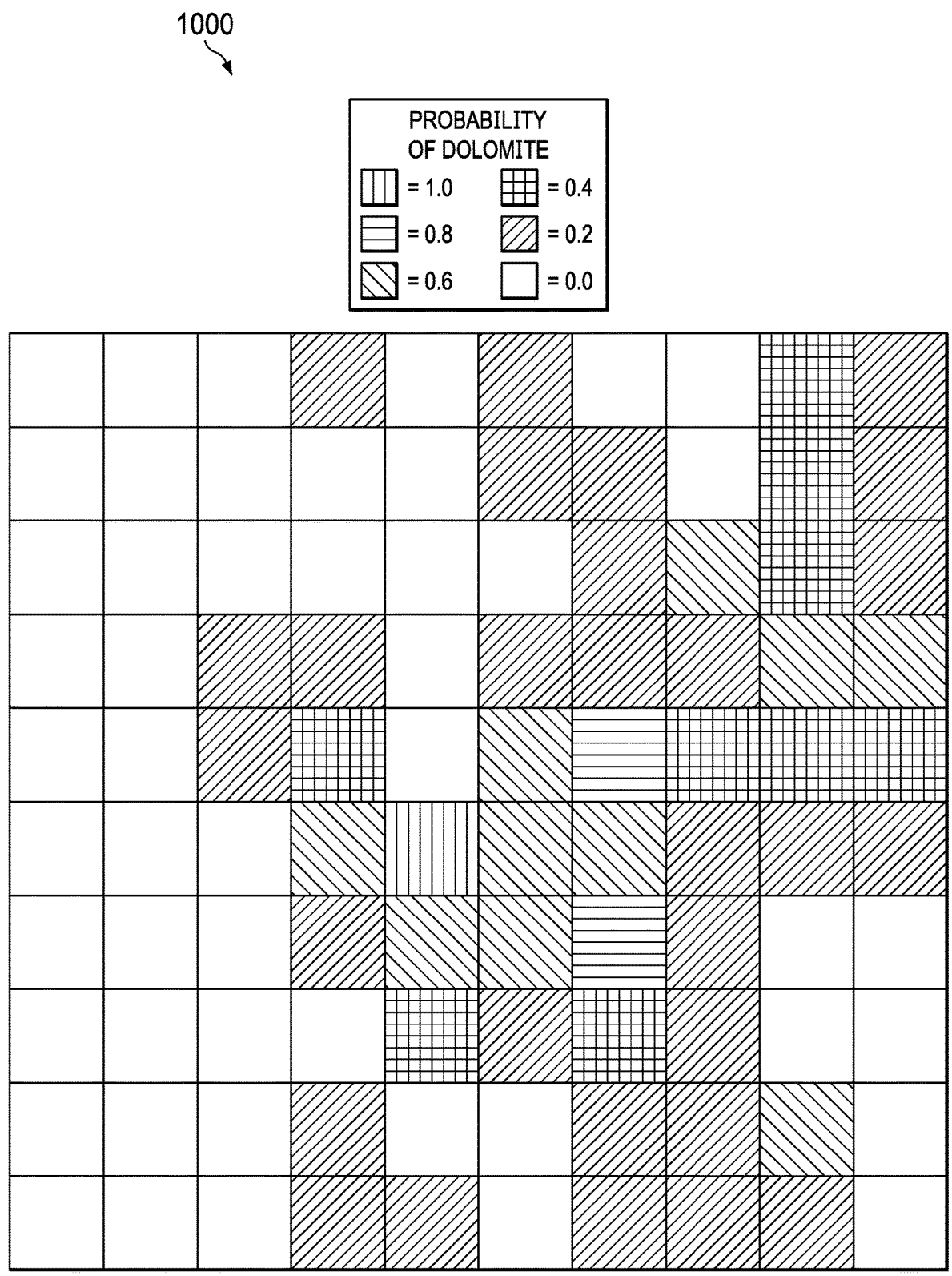
FIG. 10 illustrates the probability of dolomite in the formation of FIG. 2 based on the five different iterations of the lithological analysis illustrated in FIGS. 9A-9E.

The results of the total number of iterations of the lithological analysis are combined to determine the probability of the presence of dolomite in the formation. In that regard, FIG. 10 illustrates a graph 1000 of the probability of dolomite in the formation of FIG. 2 based on the five different iterations of the lithological analysis illustrated in FIGS. 9A-9E. In the embodiment of FIG. 10, cells associated with sections of the formation having different probabilities to contain dolomite are illustrated in different patterns. In some embodiments, cells associated with sections of the formation having different probabilities to contain dolomite are illustrated in different colors, or other types of visual representations to differentiate other cells associated with sections of the formation that have different probabilities to contain dolomite.

In some embodiments, different probabilities that a section of the formation contains different rock types of the formation are combined, and a value is assigned to each section of the formation based on the different probabilities that the respective section contains different rock types of the formation. For example, a value of 820 is assigned to a section of the formation where the lithological analysis determines that there is a 20% probability that the section, which is associated with cell 201, contains siltstone, an 80% probability that the section contains siltstone, and a 0% probability that the section contains carbonate mud or dolomite. Similarly, a value of 20800 is assigned to a section of the formation where the lithological analysis determines that there is a 20% probability that the section, which is associated with cell 276, contains dolomite, an 80% probability that the section contains siltstone, and a 0% probability that the section contains carbonate mud or high porosity siltstone. In one or more of such embodiments, the below Table T-1 is a table of different values assigned to a section of the formation having multiple rock types of the formation.

TABLE T-1

| Blended Lithology Code | % Dolomite | % Carbonate Mud | % Siltstone | % High Porosity Siltstone |
|---|---|---|---|---|
| 100 | 0 | 0 | 0 | 100 |
| 280 | 0 | 0 | 20 | 80 |
| 460 | 0 | 0 | 40 | 60 |
| 640 | 0 | 0 | 60 | 40 |
| 820 | 0 | 0 | 80 | 20 |
| 1000 | 0 | 0 | 100 | 0 |
| 2440 | 0 | 20 | 40 | 40 |
| 20440 | 20 | 0 | 40 | 40 |
| 20620 | 20 | 0 | 60 | 20 |
| 20800 | 20 | 0 | 80 | 0 |
| 22420 | 20 | 20 | 40 | 20 |
| 40420 | 40 | 0 | 40 | 20 |
| 40600 | 40 | 0 | 60 | 0 |
| 42400 | 40 | 20 | 40 | 0 |
| 60220 | 60 | 0 | 20 | 20 |
| 60400 | 60 | 0 | 40 | 0 |
| 80020 | 80 | 0 | 0 | 20 |
| 80200 | 80 | 0 | 20 | 0 |
| 100000 | 100 | 0 | 0 | 0 |

In some embodiments, the values of the above table is generated by assigning a different multiplier to each rock type, and combining the values of the different rock types found in a section of the formation. In the embodiment illustrated by Table T-1, a value from 0-100 is assigned to correspond to the probability that a section of the formation contains high porosity siltstone, where the value is the integer value of the probability is multiplied by 1 (e.g., a value of 20 is assigned if there is a 20% probability that high porosity siltstone is present in the section). Further, a value from 0-1,000 is assigned to correspond to the probability that a section of the formation contains siltstone, where the value is the integer value of the probability is multiplied by 10 (e.g., a value of 400 is assigned if there is a 40% probability that siltstone is present in the section). Further, a value from 0-10,000 is assigned to correspond to the probability that a section of the formation contains carbonate mud, where the value is the integer value of the probability is multiplied by 100 (e.g., a value of 2,000 is assigned if there is a 20% probability that carbonate mud is present in the section). Further, a value from 0-100,000 is assigned to correspond to the probability that a section of the formation contains dolomite, where the value is the integer value of the probability is multiplied by 1,000 (e.g., a value of 60,000 is assigned if there is a 60% probability that siltstone is present in the section). The value of a section of the formation is determined by adding corresponding values of different rock types of the formation that are found in the section of the formation. For example, a value of 80,200 is assigned to a section of the formation if there is an 80% probability that the section contains dolomite (80*10,000), a 0% probability that the section contains carbonate mud (0*1,000), a 20% probability that the section contains siltstone (20*10), and a 0% probability that the section contains high porosity siltstone (0*100). In some embodiments, some of the values are utilized to define different blended rock types based on the amount and type of the rock types that are present in a segment of the formation. In some embodiments, different user-designated or predetermined values are assigned to different blended rock types. In some embodiments, values are randomly assigned to different blended rock types.

FIG. 11 illustrates a graph 1100 of the formation of FIG. 2, where each cell 201-300 includes a value representative of the probability that high porosity siltstone, siltstone, carbonate mud, and dolomite, respectively, are determined present in a section associated with the corresponding cell. More particularly, values shown in cells 201-300 correspond to values shown in Table T-1, and are derived based on the methodology described herein. In some embodiments, different values correspond to different graphical representations, such as patterns, colors, or other types of graphical representations. In some embodiments, additional graphical representations of the probability that different rock types are present in the formation are provided for display. In that regard, FIG. 12 illustrates a graph 1200 of the formation of FIG. 2, where each cell 201-300 includes a pie chart and a value representative of the probability that high porosity siltstone, siltstone, carbonate mud, and dolomite, respectively, are determined present in a section associated with the corresponding cell.

Figure 13:
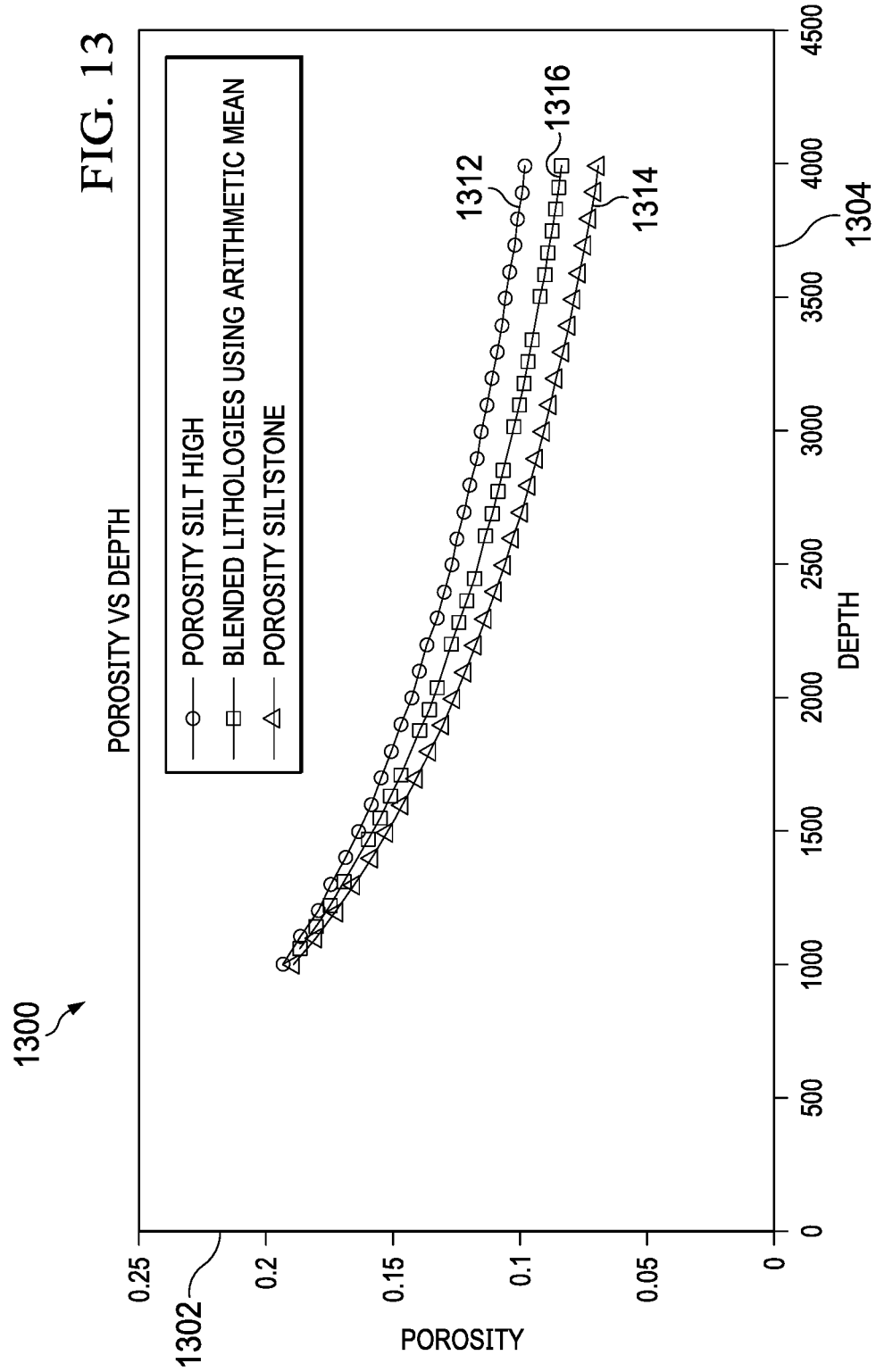
FIG. 13 illustrates a plot of the porosity of high porosity siltstone, siltstone, and a blend of the two rock types at different depths.

In some embodiments, where a section of the formation is determined to include multiple rock types, one or more physical properties of each rock type are blended together. In that regard, FIG. 13 illustrates a plot 1300 of the porosity of high porosity siltstone, siltstone, and a blend of the two rock types at different depths. In the embodiment of FIG. 13, axis 1302 represents the porosity of the rock type, and axis 1304 represents the depth of the formation. Further, plotted lines 1312, 1314, and 1316 represent the porosity of high porosity siltstone at different depths, the porosity of siltstone at different depths, and the porosity of a blended rock type containing high porosity siltstone and siltstone over different depths. In the embodiment of FIG. 13, values associated with line 1316 at certain depths are determined based on an arithmetic mean of the values of high porosity siltstone and siltstone at the same depths. In some embodiments, the values associated with line 1316 at certain depths are determined based on the maximum of the values of high porosity siltstone and siltstone at the same depths, the minimum of value of high porosity siltstone and siltstone at the same depths, the proportion values of high porosity siltstone and siltstone at the same depths, the mean arithmetic values of high porosity siltstone and siltstone at the same depths, the Root Mean Squared value of high porosity siltstone and siltstone at the same depths, or the Log Proportion value of high porosity siltstone and siltstone at the same depths.

Figure 14:
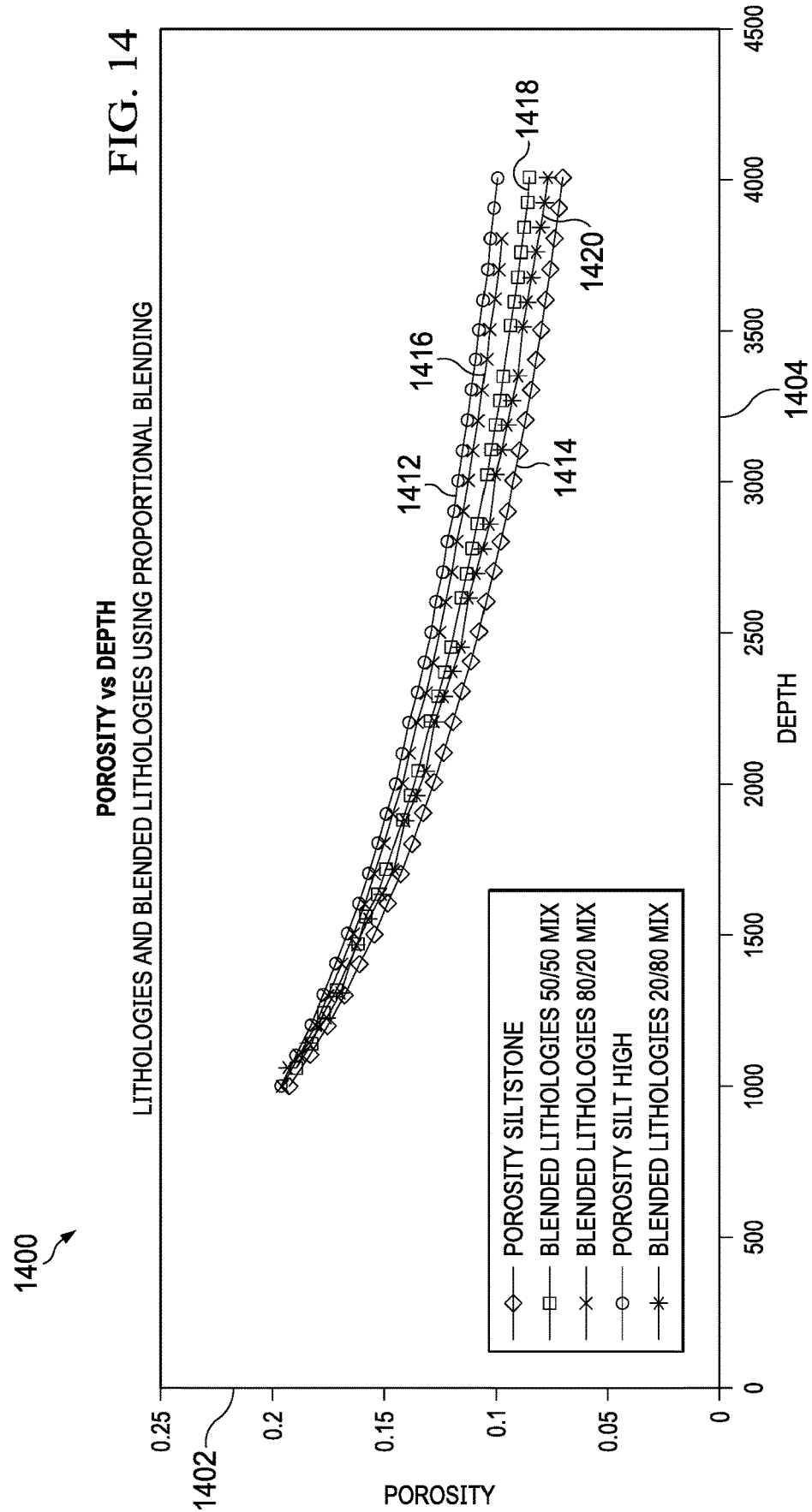
FIG. 14 illustrates a plot of the porosity of high porosity siltstone, siltstone, and three blends of the two rock types at different depths.

FIG. 14 illustrates a plot 1400 of the porosity of high porosity siltstone, siltstone, and three blends of the two rock types at different depths. In the embodiment of FIG. 14, axis 1402 represents the porosity of the rock type, and axis 1404 represents the depth of the formation. Further, plotted lines 1412, 1414, 1416, 1418, and 1420 represent the porosity of high porosity siltstone at different depths, the porosity of siltstone at different depths, and the porosity of a blended rock type containing a mixture of 80% high porosity siltstone and 20% siltstone over different depths, a blended rock type containing a mixture of 50% high porosity siltstone and 50% siltstone over different depths, and a blended rock type containing a mixture of 20% high porosity siltstone and 80% siltstone over different depths. In the embodiment of FIG. 14, plots of blended rock types containing different mixtures of high porosity siltstone and siltstone at certain depths are determined based on the proportion of each rock type in the blended rock type.

Although FIGS. 13 and 14 illustrate plots of porosity over depth, in some embodiments, the methodologies described herein are utilized to determine other types of non-constant attributes or constant attributes of different rock types. Further, although FIGS. 13 and 14 illustrate plots of blended rock types containing high porosity siltstone and siltstone, in some embodiments, the methodologies described herein are utilized to determine blended rock types containing other rock types, or containing three or more rock types.

Figure 15:
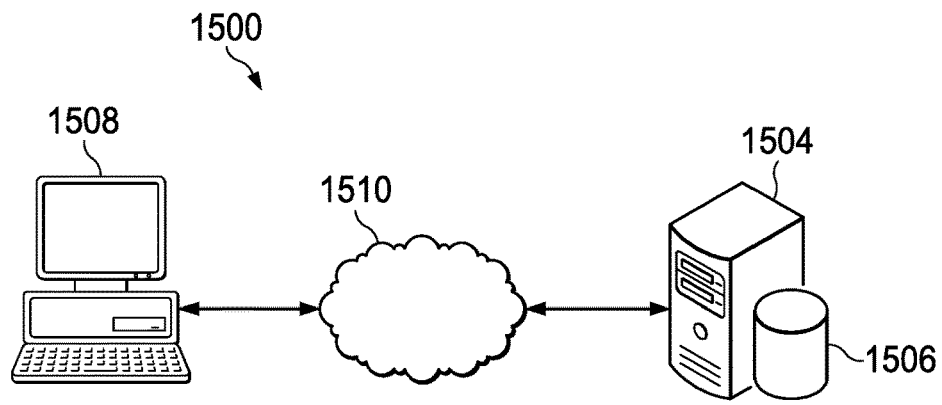
FIG. 15 is a network environment for analyzing a formation.

FIG. 15 is a network environment 1500 for analyzing a formation. In the embodiment of FIG. 15, formation data is stored in a storage medium 1506 of a formation analysis system 1504. As referred to herein, formation data includes any data related to rock types of the formation, blended rock types of the formation, and other properties of the formation. Formation analysis system 1504 obtains formation data associated with a formation from storage medium 1506. Examples of formation analysis system 1504 include work management stations, server systems, desktop computers, laptop computers, tablet computers, smartphones, smart watches, PDAs, as well as other electronic devices having hardware and software components configured to analyze a formation. Storage medium 1506 may be formed from data storage components such as, but not limited to, read-only memory (ROM), random access memory (RAM), flash memory, magnetic hard drives, solid state hard drives, CD-ROM drives, DVD drives, floppy disk drives, as well as other types of data storage components and devices. In some embodiments, the storage medium 1506 includes multiple data storage devices. In further embodiments, the multiple data storage devices may be physically stored at different locations.

Formation analysis system 1504 partitions a formation containing multiple rock types into multiple sections. For each section of the formation, and for each rock type of the formation, formation analysis system 1504 determines a probability that the rock type is present in the section. Formation analysis system 1504 assigns a value to the partition of the plurality of partitions based on a probability that the partition contains one or more rock types of the plurality of rock types, and analyzes the formation based on the value associated with the partition. Additional operations performed by formation analysis system 1504 are described herein.

In the embodiment of FIG. 15, formation analysis system 1504 is configured to provide graphical representations of a formation to an electronic device 1508 via a network 1510. Examples of the electronic device 1508 include work management stations, server systems, desktop computers, laptop computers, tablet computers, smartphones, smart watches, PDAs, as well as similar electronic devices having a processor configured to provide data indicative of the formation for display. In the illustrated embodiment, the electronic device 1508 is configured to provide graphical representations of the formation for display on an electronic display. In some embodiments, graphs illustrating different iterations of one or more lithological analysis of the formation to determine the probability of the presence of different rock types of the formation such as graphs illustrated in FIGS. 3A-3E, 5A-5E, 7A-7E, and 9A-9E, are displayed on the electronic display of electronic device 1508. In some embodiments, graphs illustrating the probability that different rock types are found in the formation, such as of graphs illustrated in FIGS. 4, 6, 8, and 10, are displayed on the electronic display of electronic device 1508. In some embodiments, data and graphical representations of different values assigned to different sections of the formation, such as graphs 1100 and 1200 of FIGS. 11 and 12, are displayed on the electronic display of electronic device 1508. Network 106 includes, for example, any one or more of a cellular network, a satellite network, a personal area network (PAN), a local area network (LAN), a wide area network (WAN), a broadband network (BBN), the Internet, and the like. Further, the network 106 can include, but is not limited to, any one or more of the following network topologies, including a bus network, a star network, a ring network, a mesh network, a star-bus network, tree or hierarchical network, or similar network architecture.

Although formation data is stored in storage medium 1506, in some embodiments, formation data and other data utilized to perform operations described herein are stored in another storage medium (not shown) that is communicatively connected to formation analysis system 1504. Further, although FIG. 15 illustrates formation analysis system 1504 and electronic device 1508 as two separate electronic devices, in some embodiments, formation analysis system 1504 and electronic device 1508 are the same electronic device. In some embodiments, formation analysis system 1504 includes or is communicatively connected to an electronic display and is configured to display visual representations of a formation on the electronic display.

Figure 16:
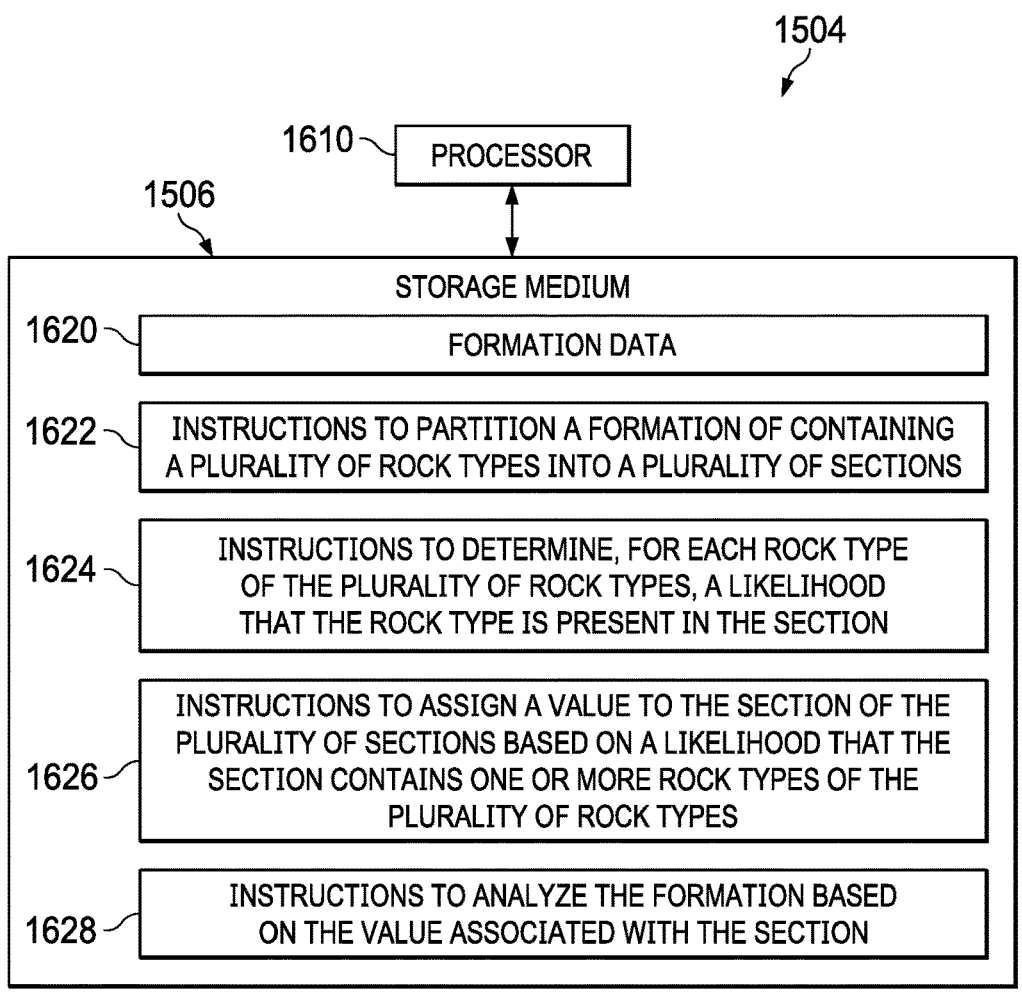
FIG. 16 is a block diagram of the formation analysis system of FIG. 15 that is configured to perform operations illustrated in the process of FIG. 1 to analyze a formation.

FIG. 16 is a block diagram of formation analysis system 1504 of FIG. 15, where formation analysis system 1504 is configured to perform the operations illustrated in process 100 of FIG. 1 to analyze a formation. The formation analysis system 1504 includes storage medium 1506 of FIG. 15 and a processor 1610. Formation data is stored at a first location 1620 of storage medium 1520. As shown in FIG. 16, instructions to partition a formation containing a plurality of rock types into a plurality of sections are stored in a second location 1622. Further, instructions to determine, for each rock type of the plurality of rock types, a probability that the rock type is present in the section are stored in a third location 1624. Further, instructions to assign a value to the section of the plurality of sections based on a probability that the section contains one or more rock types of the plurality of rock types are stored at a fourth location 1626. Further, instructions to analyze the formation based on the value associated with the section are stored at a fifth location 1628. Further, instructions to perform mythologies and operations described herein are also stored in other locations of the storage medium 1506.

The above-disclosed embodiments have been presented for purposes of illustration and to enable one of ordinary skill in the art to practice the disclosure, but the disclosure is not intended to be exhaustive or limited to the forms disclosed. Many insubstantial modifications and variations will be apparent to those of ordinary skill in the art without departing from the scope and spirit of the disclosure. For instance, although the flowcharts depict a serial process, some of the steps/processes may be performed in parallel or out of sequence, or combined into a single step/process. The scope of the claims is intended to broadly cover the disclosed embodiments and any such modification. Further, the following clauses represent additional embodiments of the disclosure and should be considered within the scope of the disclosure.

Clause 1, a computer-implemented method to analyze a formation, comprising: partitioning a formation containing a plurality of rock types into a plurality of sections; for a section of the plurality of sections, determining, for each rock type of the plurality of rock types, a probability that the rock type is present in the section; assigning a value to the section of the plurality of sections based on a probability that the section contains one or more rock types of the plurality of rock types; and analyzing the formation based on the value associated with the section.

Clause 2, the computer-implemented method of clause 1, further comprising blending a physical property of each rock type of the plurality of rock types determined to be present in the section to determine a blended physical property of the plurality of rock types determined to be present in the section, wherein the value assigned to the section is based on the blended physical property of the plurality of rock types.

Clause 3, the computer-implemented method of clause 2, wherein the physical property is a non-constant attribute.

Clause 4, the computer-implemented method of clause 2, wherein the physical property is a constant attribute.

Clause 5, the computer-implemented method of any of clauses 1-4, further comprising: for a second section of the plurality of sections, determining, for each rock type of the plurality of rock types, a probability that the rock type is present in the second section; assigning a second value to the second section of the plurality of sections based on a probability that the second section contains one or more rock types of the plurality of rock types; and analyzing the formation based on the value associated with the second section.

Clause 6, the computer-implemented method of any of clauses 1-5, further comprising: generating a model of the formation based on values associated with the plurality of sections; and providing the model for display on an electronic display.

Clause 7, the computer-implemented method of clause 6, further comprising assigning a different color to each different value of the values associated with the plurality of sections, wherein providing the model for display comprises displaying the model in different colors.

Clause 8, the computer-implemented method of any of clauses 1-7, further comprising utilizing values associated with the plurality of sections to enhance a fluid flow model of fluid flow through the formation.

Clause 9, the computer-implemented method of any of clauses 1-8, further comprising determining, based on values associated with the plurality of sections, an amount of hydrocarbon resources in the formation.

Clause 10, the computer-implemented method of any of clauses 1-9, further comprising: conducting a petrophysical analysis of a lithology of the formation to determine the plurality of rock types of the formation; and generating a structural modeling of the formation.

Clause 11, the computer-implemented method of any of clauses 1-10, wherein determining the probability that the rock type is present in the section comprises performing a threshold number of iterations of a lithological analysis of the rock type to determine the probability that the rock type is present in the section.

Clause 12, the computer-implemented method of clause 11, further comprising determining a ratio of a number of times the rock type is determined to be present in the section to the threshold number of iterations of the lithological analysis is performed, wherein the probability that the rock type is present in the section is the ratio.

Clause 13, the computer-implemented method of clauses 11 or 12, further comprising: receiving a user-designated number of iterations of the lithological analysis of the rock type; and designating the user-designated number of iterations as the threshold number of iterations.

Clause 14, the computer-implemented method of any of clauses 11-13, further comprising: assigning a blended rock type based on the value; and designating the section to include the blended rock type.

Clause 15, a formation analysis system, comprising: a storage medium; and one or more processors configured to: partition a formation containing a plurality of rock types into a plurality of sections; for each section of the plurality of sections, determining, for each rock type of the plurality of rock types, a probability that the rock type is present in the section; assign a value to the section of the plurality of sections based on a probability that the section contains one or more rock types of the plurality of rock types; and analyze the formation based on the value associated with the section.

Clause 16, the formation analysis system of clause 15, wherein the one or more processors are further configured to blend a physical property of each rock type of the plurality of rock types determined to be present in the section to determine a blended physical property of the plurality of rock types determined to be present in the section, wherein the value assigned to the section is based on the blended physical property of the plurality of rock types.

Clause 17, the formation analysis system of clauses 15 or 16, wherein the one or more processors are further configured to determine the probability that the rock type is present in the section comprises performing a threshold number of iterations of a lithological analysis of the rock type to determine the probability that the rock type is present in the section.

Clause 18, the formation analysis system of clause 17, wherein the one or more processors are further configured to determine a ratio of a number of times the rock type is determined to be present in the section to the threshold number of iterations of the lithological analysis is performed, wherein the probability that the rock type is present in the section is the ratio.

Clause 19, a machine-readable medium comprising instructions stored therein, which when executed by one or more processors, causes the one or more processors to perform operations comprising: partitioning a formation containing a plurality of rock types into a plurality of sections; for each section of the plurality of sections: performing, for each rock type of the plurality of rock types, a threshold number of iterations of a lithological analysis of the rock type; and determining, for each rock type of the plurality of rock types, a probability that the rock type is present in the section based on results of the threshold number of iterations of the lithological analysis; assigning a value to the section of the plurality of sections based on a probability that the section contains one or more rock types of the plurality of rock types; and analyzing the formation based on the value associated with the section.

The machine-readable medium of clause 19, further comprising instructions stored therein, which when executed by one or more processors, causes the one or more processors to perform operations comprising performing a threshold number of iterations of a lithological analysis of the rock type to determine the probability that the rock type is present in the section.

As used herein, the singular forms "a," "an," and "the" are intended to include the plural forms as well, unless the context clearly indicates otherwise. It will be further understood that the terms "comprise" and/or "comprising," when used in this specification and/or the claims, specify the presence of stated features, steps, operations, elements, and/or components, but do not preclude the presence or addition of one or more other features, steps, operations, elements, components, and/or groups thereof. In addition, the steps and components described in the above embodiments and figures are merely illustrative and do not imply that any particular step or component is a requirement of a claimed embodiment.

What is claimed is:

1. A computer-implemented method to analyze a formation, comprising:
   partitioning a formation containing a plurality of rock types into a plurality of sections;
   for each section of the plurality of sections:
      determining, for each rock type of the plurality of rock types, a probability that the rock type is present in the section,
      blending a physical property of each rock type of the plurality of rock types determined to be present in the section,
      determining a blended physical property of the plurality of rock types determined to be present in the section,
      assigning a value to the section of the plurality of sections based on a probability that the section contains one or more rock types of the plurality of rock types, wherein the value assigned to the section is based on the blended physical property of the plurality of rock types, and
      analyzing the formation based on the value associated with the section; and
   recovering, using the analysis of the formation based on the values associated with the plurality of sections, hydrocarbon resources in the formation.

2. The computer-implemented method of claim 1, wherein the physical property is a non-constant attribute.

3. The computer-implemented method of claim 1, wherein the physical property is a constant attribute.

4. The computer-implemented method of claim 1, further comprising:
   generating a model of the formation based on the values associated with the plurality of sections; and
   providing the model for display on an electronic display.

5. The computer-implemented method of claim 4, further comprising assigning a different color to each different value of the values associated with the plurality of sections, wherein providing the model for display comprises displaying the model in different colors.

6. The computer-implemented method of claim 1, further comprising utilizing the values associated with the plurality of sections to enhance a fluid flow model of fluid flow through the formation.

7. The computer-implemented method of claim 1, further comprising determining, based on the values associated with the plurality of sections, an amount of the hydrocarbon resources in the formation.

8. The computer-implemented method of claim 1, further comprising:
   conducting a petrophysical analysis of a lithology of the formation to determine the plurality of rock types of the formation; and
   generating a structural modeling of the formation.

9. The computer-implemented method of claim 1, wherein determining the probability that the rock type is present in the section comprises performing a threshold number of iterations of a lithological analysis of the rock type to determine the probability that the rock type is present in the section.

10. The computer-implemented method of claim 9, further comprising determining a ratio of a number of times the rock type is determined to be present in the section to the threshold number of iterations of the lithological analysis is performed, wherein the probability that the rock type is present in the section is the ratio.

11. The computer-implemented method of claim 9, further comprising:
    receiving a user-designated number of iterations of the lithological analysis of the rock type; and
    designating the user-designated number of iterations as the threshold number of iterations.

12. The computer-implemented method of claim 9, further comprising:
    assigning a blended rock type based on the value; and
    designating the section to include the blended rock type.

13. A formation analysis system, comprising:
    a storage medium; and
    one or more processors configured to:
    partition a formation containing a plurality of rock types into a plurality of sections;
    for each section of the plurality of sections:
       determine, for each rock type of the plurality of rock types, a probability that the rock type is present in the section;
       blend a physical property of each rock type of the plurality of rock types determined to be present in the section,
       determine a blended physical property of the plurality of rock types determined to be present in the section,
       assign a value to the section of the plurality of sections based on a probability that the section contains one or more rock types of the plurality of rock types, wherein the value assigned to the section is based on the blended physical property of the plurality of rock types, and
       analyze the formation based on the value associated with the section; and
    recover, using the analysis of the formation based on the values associated with the plurality of sections, hydrocarbon resources in the formation.

14. The formation analysis system of claim 13, wherein the one or more processors are further configured to determine the probability that the rock type is present in the section comprises performing a threshold number of iterations of a lithological analysis of the rock type to determine the probability that the rock type is present in the section.

15. The formation analysis system of claim 14, wherein the one or more processors are further configured to determine a ratio of a number of times the rock type is determined to be present in the section to the threshold number of iterations of the lithological analysis is performed, wherein the probability that the rock type is present in the section is the ratio.

16. A non-transitory machine-readable medium comprising instructions stored therein, which when executed by one or more processors, causes the one or more processors to perform operations comprising:

partitioning a formation containing a plurality of rock types into a plurality of sections;

for each section of the plurality of sections:

performing, for each rock type of the plurality of rock types, a threshold number of iterations of a lithological analysis of the rock type, determining, for each rock type of the plurality of rock types, a probability that the rock type is present in the section based on results of the threshold number of iterations of the lithological analysis, blending a physical property of each rock type of the plurality of rock types determined to be present in the section, determining a blended physical property of the plurality of rock types determined to be present in the section, assigning a value to the section of the plurality of sections based on a probability that the section contains one or more rock types of the plurality of rock types, wherein the value assigned to the section is based on the blended physical property of the plurality of rock types; and analyzing the formation based on the value associated with the section; and recovering, using the analysis of the formation based on the values associated with the plurality of sections, hydrocarbon resources in the formation.

17. The non-transitory machine-readable medium of claim 16, further comprising instructions stored therein, which when executed by one or more processors, causes the one or more processors to perform operations comprising performing a threshold number of iterations of a lithological analysis of the rock type to determine the probability that the rock type is present in the section.

* * * * *